US 10,487,243 B2

(12) United States Patent
Grottenmueller et al.

(10) Patent No.: US 10,487,243 B2
(45) Date of Patent: Nov. 26, 2019

(54) FORMULATION FOR LED ENCAPSULATION MATERIAL

(71) Applicant: AZ Electronic Materials (Luxembourg) S.a.r.l., Luxembourg (LU)

(72) Inventors: Ralf Grottenmueller, Wiesbaden (DE); Abraham Casas Garcia-Minguillan, Wiesbaden (DE); Fumio Kita, Wiesbaden (DE); Dieter Wagner, Wiesbaden (DE); Robert J. Wiacek, Baltimore, MD (US); Daniel P. Russell, Baltimore, MD (US); Zehra Serpil Gonen Williams, Baltimore, MD (US)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 0 days.

(21) Appl. No.: 16/316,776

(22) PCT Filed: Jul. 14, 2017

(86) PCT No.: PCT/EP2017/067804
§ 371 (c)(1),
(2) Date: Jan. 10, 2019

(87) PCT Pub. No.: WO2018/015283
PCT Pub. Date: Jan. 25, 2018

(65) Prior Publication Data
US 2019/0300748 A1    Oct. 3, 2019

Related U.S. Application Data

(60) Provisional application No. 62/363,578, filed on Jul. 18, 2016.

(51) Int. Cl.
*H01L 33/56* (2010.01)
*C09D 183/14* (2006.01)
(Continued)

(52) U.S. Cl.
CPC .............. *C09D 183/14* (2013.01); *C09D 5/22* (2013.01); *C09D 7/62* (2018.01); *H01L 33/504* (2013.01);
(Continued)

(58) Field of Classification Search
None
See application file for complete search history.

(56) References Cited

U.S. PATENT DOCUMENTS 9,139,670 B2 *  9/2015  Joly ................. B82Y 30/00
2002/0165319 A1  11/2002  Knasiak et al.
(Continued)

FOREIGN PATENT DOCUMENTS

EP        2733117 A2     5/2014
WO    WO-02068535 A1    9/2002
(Continued)

OTHER PUBLICATIONS

International Search Report for PCT/EP2017/067804 dated Oct. 6, 2017.
(Continued)

*Primary Examiner* — Jack S Chen
(74) *Attorney, Agent, or Firm* — Drinker Biddle & Reath LLP

(57) ABSTRACT

The present invention relates to a formulation suitable for the preparation of a highly refractive encapsulation material with good barrier properties towards water vapor for an LED, to an encapsulation material for an LED having a high refractive index and good barrier properties towards water vapor which is obtainable from said formulation and to a
(Continued)

light emitting device (LED) comprising said encapsulation material. The formulation comprises a polymer comprising a first repeating unit $M^1$ and a second repeating unit $M^2$; and a surface-modified zirconium dioxide nanocrystal.

18 Claims, 5 Drawing Sheets

(51) Int. Cl.
*C09D 5/22* (2006.01)
*C09D 7/62* (2018.01)
*H01L 33/50* (2010.01)

(52) U.S. Cl.
CPC ........ H01L 33/56 (2013.01); *H01L 2933/005* (2013.01); *H01L 2933/0041* (2013.01)

(56) References Cited

U.S. PATENT DOCUMENTS

| | | |
|---|---|---|
| 2005/0154124 A1 | 7/2005 | Yoshitake et al. |
| 2008/0317794 A1 | 12/2008 | Gellermann et al. |
| 2009/0272996 A1 | 11/2009 | Chakraborty |
| 2015/0188006 A1 | 7/2015 | Williams et al. |
| 2015/0274895 A1 | 10/2015 | Okawa et al. |
| 2016/0233391 A1* | 8/2016 | Xu .................. H01L 27/322 |
| 2017/0210944 A1 | 7/2017 | Grottenmuller et al. |

FOREIGN PATENT DOCUMENTS

| | | |
|---|---|---|
| WO | WO-2007047260 A1 | 4/2007 |
| WO | WO-2012067766 A2 | 5/2012 |
| WO | WO-2014062871 A1 | 4/2014 |
| WO | WO-2015007778 A1 | 1/2015 |
| WO | WO-2016016260 A1 | 2/2016 |

OTHER PUBLICATIONS

International Search Report for PCT/EP2017/067809 dated Oct. 6, 2017.
Lü, Changli, et al., "High refractive index organic-inorganic nanocomposites: design, synthesis and application", Journal of Materials Chemistry, vol. 19, No. 19, (2009), pp. 2884-2901.
Written Opinion of the International Searching Authority for PCT/EP2017/067804 dated Oct. 6, 2017.
Written Opinion of the International Searching Authority for PCT/EP2017/067809 dated Oct. 6, 2017.

* cited by examiner

| % Mass at 200 C | % Mass at 700 C | % Organics (%@200C-%@700C)/%@200C |
|---|---|---|
| 70.62% | 63.93% | 9.47% |

FORMULATION FOR LED ENCAPSULATION MATERIAL

CROSS-REFERENCE TO RELATED APPLICATIONS

This application is a national stage application (under 35 U.S.C. § 371) of PCT/EP2017/067804, filed Jul. 14, 2017, which claims benefit of U.S. Application No. 62/363,578, filed Jul. 18, 2016, both of which are incorporated herein by reference in their entirety.

TECHNICAL FIELD

The present invention relates to a formulation suitable for the preparation of a highly refractive encapsulation material for a light emitting device (LED), to an encapsulation material for an LED having a high refractive index which is obtainable from said formulation and to an LED comprising said highly refractive encapsulation material. Moreover, the present invention relates to a method for preparing a formulation suitable for the preparation of a highly refractive encapsulation material for an LED. The present invention further relates to a method for producing an LED by using said formulation. The formulation according to the invention is particularly suitable for the preparation of an encapsulation material for LEDs, in particular for phosphor-converted LEDs (pc-LEDs) having a converter layer with high refractive index. Moreover, the formulation allows a more efficient processability due to a faster curing rate. The encapsulation material according to the present invention provides a high refractive index which shows a low temperature dependence and thereby allows the preparation of high-performance LEDs having an increased light output and an improved colour point stability. Moreover, the encapsulation material shows improved barrier properties towards water vapor.

Background and description of the prior art There is a high demand in the LED industry to find suitable encapsulation materials for LEDs. Such materials face several challenges:

i. The encapsulation material has to withstand high temperatures without degradation in mechanical and/or optical properties.
ii. The encapsulation material needs to have, in addition to optical clarity and high temperature tolerance, the advantageous property of a high refractive index.
iii. The capability of the encapsulation material to withstand exposure to radiation of high intensity needs to be high.
iv. There is a need for encapsulation materials that can be varied in elastic modulus across a wide range from very soft gel materials to hard plastic materials.

LEDs can generate both high thermal flux and high optical flux. The LED package as well as the encapsulation material need to perform stably when exposed to heat and/or radiation (ultra-violet (UV) and/or visible (VIS) radiation). The right encapsulation material plays a major role in improving LED performance. So far, many encapsulation materials suffer from, among other, loss of transmittance during the lifetime of usage of the LED. In the following, advantages and remaining disadvantages of the main encapsulation materials are shown. Silicon-based materials are currently dominating the market because of their advantageous optical, mechanical and aging properties. Silicone reflectors improve brightness performance, show superior heat resistance and photo-thermal stability when compared with conventional materials. With silicone-based reflectors there is minor degradation of the LED light intensity; they reflect light with a high efficiency of more than 98%. Silicones as protective films on chips show high heat resistance. The silicone can be compounded with a phosphor to make a white LED. Silicones can be dispensed or molded easily. Main applications are general lighting products such as LEDs and backlighting products in liquid crystal displays (LCDs).

One of the disadvantage of silicones is that they are highly transmissive and gas permeable. At elevated temperatures, chemical contaminants such as volatile organic compounds (VOCs) outgassing from the circuit board can cause discolouration, specifically yellowing over time. VOCs can accelerate the degradation of LEDs or impair the performance of LEDs. The effect of chemical incompatibility was seen in blue and white LEDs but not in red or green LEDs. Silicones also yellow from light and heat. Silicones are also permeable for moisture which enhances degradation and reduces the LED performance. Another disadvantage of silicones is the high CTE (320 ppm/° C., Electronic Packaging and Interconnection Handbook). The refractive index should also be higher.

The advantages of glass are superior optical properties and durability. That makes it attractive for high end applications. But clear disadvantages of glass are its incompatibility with standard LED manufacturing processes.

Epoxides are known for their excellent adhesion, chemical and heat resistance, good-to-excellent mechanical properties, and very good electrical insulating properties. But epoxides have poor aging characteristics. They show poor moisture resistance due to high water absorption and especially poor light resistance due to low transmittance for short wavelength light.

The choice of a suitable encapsulation material is highly driven by its aging stability against UV and high temperature as well as its processability. Encapsulation materials and the corresponding polymer formulations from which they are prepared for the manufacturing of LEDs need to satisfy several requirements. Besides optimal barrier properties towards water vapor and mechanical and optical stability, a high refractive index is required. The refractive index of a typical Gallium Nitride LED chip is about 2.4. The light leaving the LED chip into an encapsulation material having a lower refractive index is limited by total internal reflection on the interface.

Similarly, there is an index mismatch with the phosphors embedded in the encapsulation material. A higher refractive index of the encapsulation material mitigates this effect and therefore increases the brightness of the LED. So far, phenyl silicones with a refractive index of up to 1.54 are used as high refractive index encapsulation materials. The drawback of such materials is the presence of aromatic groups which limits their thermal and optical stability. Furthermore, the mixing of silicones with nanocrystals having a high refractive index to prepare stable dispersions has been difficult, due to the incompatibility of silicones with most other materials leading to aggregation of the nanocrystals.

Hence, there is a strong need for new encapsulation materials that are stable and have a high refractive index with a low temperature dependence and that allows for the preparation of high-performance LEDs with increased light output, improved colour point stability, and barrier properties towards water vapor. Moreover, there is a strong need for new formulations allowing an efficient preparation of the above-mentioned new encapsulation materials.

Until now, no LED encapsulation materials have been reported which have a high refractive index and high transparency accompanied by resistance to yellowing caused by thermal degradation above 150° aging in air (Kim et al., 2010, Chemistry of Materials).

WO 2012/067766 discloses LEDs comprising a polysilazane bonding layer. The bonding layer typically further comprises a (meth)acrylate monomer.

WO 2014/062871 A1 relates to composite materials for LEDs including a matrix and at least one filler, wherein the matrix is a core-shell particle assembly containing an inorganic core and a polymeric shell.

WO 2015/007778 A1 introduces new encapsulation materials for LEDs which are based on specific organopolysilazanes. Polysilazane/polysiloxane copolymers have been described in US 2015/0188006 A1 as encapsulation polymers. Polysilazane/polysiloxane block copolymers are also known from WO 2002/068535 A1.

EP 2 733 117 A2 relates to inorganic fine particle scattering films and a manufacturing method thereof, wherein an inorganic fine particle layer comprising pores is formed on an LED interface or a transparent substrate so as to achieve a high light extraction effect through a light scattering effect, and a planarizing layer is formed on the inorganic fine particle layer so as to show a high flatness and a high hardness.

US 2009/0272996 A1 relates to phosphor-converted LEDs, wherein the light extraction efficiency and the colour temperature distribution uniformity are improved by the introduction of both nanoparticles and light scattering particles proximate to the light source.

However, the LED encapsulation materials known from the state of the art leave some room for improvement, particularly with regard to better LED properties such as an increased efficiency and improved colour point stability.
Technical Problem and Object of the Present Invention Various polymer formulations for the preparation of encapsulation materials for LEDs have been proposed. However, there is a continuing need to improve these polymer formulations and the obtained encapsulation materials so that they allow an efficient production of LEDs having an increased efficiency due to an increased light output, an improved colour point stability, especially after aging, and a converter layer with enhanced barrier properties towards water vapor. Moreover, there is a strong need for new encapsulation materials having a high refractive index which depends minimally from temperature.

It is therefore an aim of the present invention to overcome the disadvantages in the prior art and to provide a new polymer formulation which is suitable for the preparation of a highly refractive encapsulation material for LEDs having an increased light output and an improved colour point stability. It is a further object of the present invention to provide a method for preparing a polymer formulation which is suitable for the preparation of a highly refractive encapsulation material for LEDs. Moreover, it is an object of the present invention to provide an LED comprising said highly refractive encapsulation material and having enhanced barrier properties towards water vapor. Beyond that, it is an object of the present invention to provide a method for preparing an LED by using said polymer formulation in an efficient way.

The polymer formulation according to the present invention is particularly suitable for the preparation of an encapsulation material for LEDs, in particular for converter layers of phosphor-converted LEDs (pc-LEDs) having a high refractive index. Moreover, the polymer formulation exhibits a faster curing rate when compared to conventional polymer formulations and thereby allows a more efficient processability. The encapsulation material of the present invention provides a high refractive index having a low temperature dependence and thereby allows producing high-performance LEDs having an increased light output, improved colour point stability, and enhanced barrier properties towards water vapor.

SUMMARY OF THE INVENTION

The present inventors have surprisingly found that the above objects can be solved either individually or in any combination by a formulation comprising: a polymer containing a first repeating unit $M^1$ and a second repeating unit $M^2$; and a surface-modified zirconium dioxide nanocrystal; wherein the first repeating unit $M^1$ is represented by formula (I) and the second repeating unit $M^2$ is represented by formula (II):

$$—[—SiR^1R^2—NR^5—]— \quad (I)$$

$$—[—SiR^3R^4—[—O—SiR^3R^4—]_a—NR^5—]— \quad (II)$$

wherein $R^1$, $R^2$, $R^3$, $R^4$ and $R^5$ are at each occurrence independently from each other selected from the group consisting of hydrogen, organyl and organoheteryl; and a is an integer from 1 to 60.

Moreover, an encapsulation material for an LED is provided, wherein the encapsulation material is obtainable by
(a) providing a formulation according to the invention; and
(b) curing said formulation at a temperature of 70 to 300° C. for a period of 1 to 24 h.

There is further provided an LED comprising the inventive encapsulation material.

In addition, a method for preparing a formulation according to the invention is provided, wherein the polymer containing a first repeating unit $M^1$ and a second repeating unit $M^2$ is mixed with a dispersion of the surface-modified zirconium dioxide nanocrystals.

Finally, the present invention provides a method for producing an LED comprising the following steps:
(a) applying a formulation according to the invention to an LED precursor; and
(b) curing the formulation at a temperature of 70 to 300° C. for a period of 1 to 24 h.

Further embodiments which are preferred are described in the dependent claims below.

- - Polymer 3+surface-modified $ZrO_2$ nanocrystal, calculated curve

Figure 6:
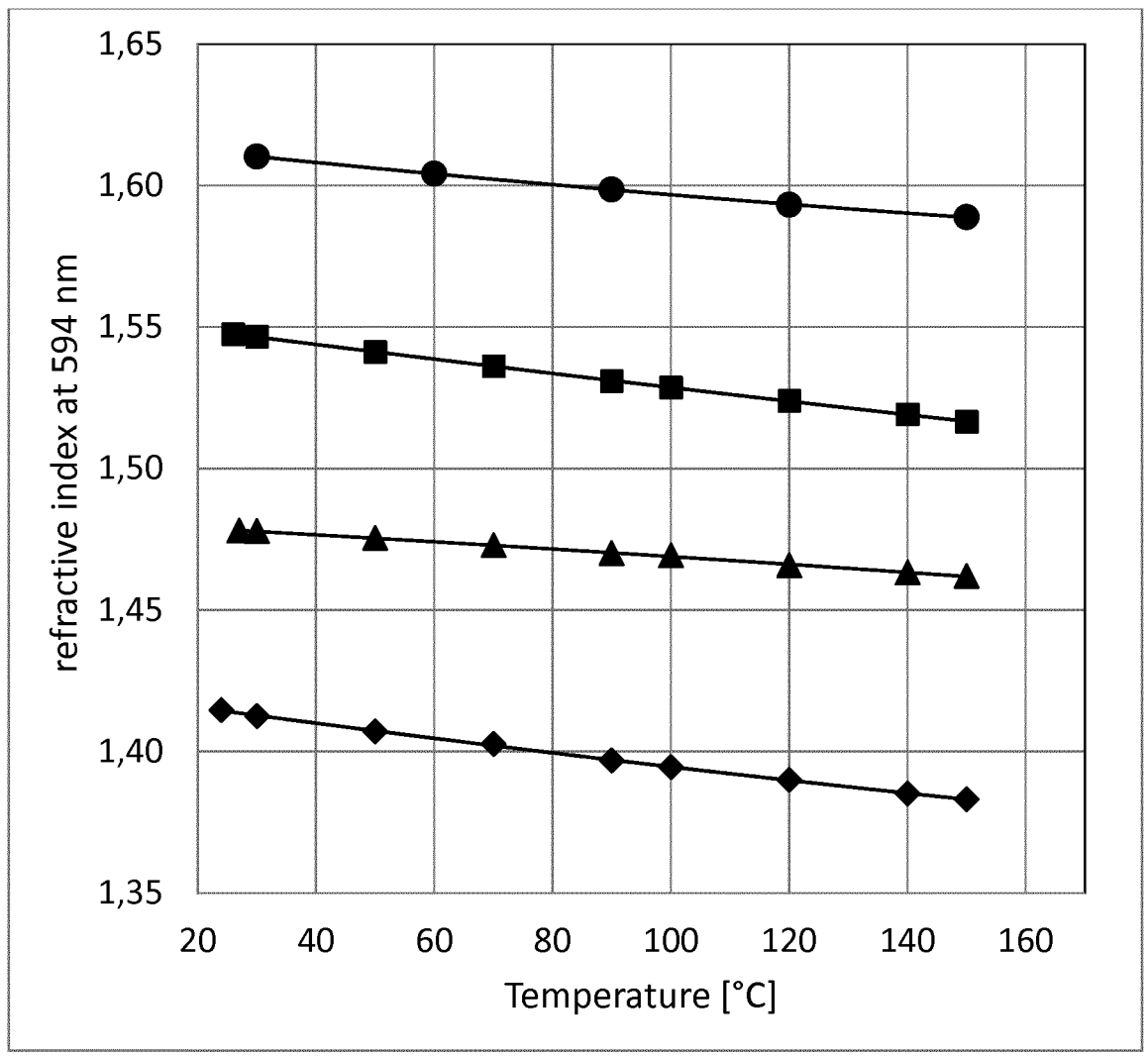

FIG. 6 shows the refractive index as a function of the temperature:
- Polymer 3+surface-modified $ZrO_2$ nanocrystal, Δ refraction index (25→150° C.)=−1.33%
- ■ Phenylsilicone, Δ refraction index (25→150° C.)=−1.94%
- ▲ Polymer 3, Δ refraction index (25→150° C.)=−1.07%
- ♦ Methylsilicone, Δ refraction index (25→150° C.)=−2.08%

DETAILED DESCRIPTION OF THE INVENTION

The term "encapsulation material" or "encapsulant" as used herein means a material which covers or encloses a converter. Preferably, the encapsulation material forms part of a converter layer which contains one or more converters. The converter layer may be either arranged directly on a semiconductor light source (LED chip) or alternatively arranged remote therefrom, depending on the respective type of application. The converter layer may be present as a film having different thicknesses or having an uniform thickness. The encapsulation material forms a barrier against the external environment of the LED device, thereby protecting the converter and/or the LED chip. The encapsulating material is preferably in direct contact with the converter and/or the LED chip. Usually, the encapsulation material forms part of an LED package comprising an LED chip and/or lead frame and/or gold wire, and/or solder (flip chip), the filling material, converter and a primary and secondary optic. The encapsulation material may cover an LED chip and/or lead frame and/or gold wire and may contain a converter. The encapsulation material has the function of a surface protection material against external environmental influences and guarantees long term reliability that means aging stability. Preferably, the converter layer containing the encapsulation material has a thickness of 1 μm to 1 cm, more preferably of 10 μm to 1 mm.

The external environmental influences that the encapsulation material needs to protect the LED from may be chemical, such as moisture, acids, bases, oxygen within others, or physical, such as temperature, mechanical impact, or stress. The encapsulant shows temperature resistance between −55 to +260° C. The encapsulation material of the present invention can act as a binder for the converter, such as a phosphor powder or a quantum material (e.g. quantum dots). The encapsulant can also be shaped in order to provide primary optic functions (lens).

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote a homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

The term "LED" as used herein means an LED device comprising one or more of a semiconductor light source (LED chip), lead frame, wiring, solder (flip chip), converter, filling material, encapsulation material, primary optics and/or secondary optics. An LED may be prepared from an LED precursor containing a semiconductor light source (LED chip) and/or lead frame and/or gold wire and/or solder (flip chip). In an LED precursor neither the LED chip nor the converter is enclosed by an encapsulation material. Usually, the encapsulation material and the converter form part of a converter layer. Such converter layer may be either arranged directly on an LED chip or alternatively arranged remote therefrom, depending on the respective type of application.

The term "converter" as used herein means a material that converts light of a first wavelength to light of a second wavelength, wherein the second wavelength is different from the first wavelength. Converters are phosphors or quantum materials.

A "phosphor" is a fluorescent inorganic material which contains one or more light emitting centers. The light emitting centers are formed by activator elements such as e.g. atoms or ions of rare earth metal elements, for example La, Ce, Pr, Nd, Pm, Sm, Eu, Gd, Tb, Dy, Ho, Er, Tm, Yb and Lu, and/or atoms or ions of transition metal elements, for example Cr, Mn, Fe, Co, Ni, Cu, Ag, Au and Zn, and/or atoms or ions of main group metal elements, for example Na, Tl, Sn, Pb, Sb and Bi. Examples of suitable phosphors include phosphors based on garnet, silicate, orthosilicate, thiogallate, sulfide, nitride, silicon-based oxynitride, nitridosilicate, nitridoaluminiumsilicate, oxonitridosilicate, oxonitridoaluminiumsilicate and rare earth doped sialon. Phosphors within the meaning of the present application are materials which absorb electromagnetic radiation of a specific wavelength range, preferably blue and/or ultraviolet (UV) electromagnetic radiation, and convert the absorbed electromagnetic radiation into electromagnetic radiation having a different wavelength range, preferably visible (VIS) light such as violet, blue, green, yellow, orange or red light.

A "quantum material" is a semiconductor nanocrystal forming a class of nanomaterials with physical properties that are widely tunable by controlling particle size, composition and shape. Among the most evident size dependent property of this class of materials is the tunable fluorescence emission. The tunability is afforded by the quantum confinement effect, where reducing particle size leads to a 'particle in a box' behavior, resulting in a blue shift of the band gap energy and hence the light emission. For example, in this manner, the emission of CdSe nanocrystals can be tuned from 660 nm for particles of diameter of ~6.5 nm, to 500 nm for particles of diameter of ~2 nm. Similar behavior can be achieved for other semiconductors when prepared as nanocrystals allowing for broad spectral coverage from the UV (using ZnSe, CdS for example) throughout the visible (using CdSe, InP for example) to the near-IR (using InAs for example). Changing the nanocrystal shape was demonstrated for several semiconductor systems, where especially prominent is the rod shape. Nanorods show properties that are modified from the spherical particles. For example, they exhibit emission that is polarized along the long rod axis, while spherical particles exhibit unpolarized emission. Moreover, we showed that nanorods have advantageous properties in optical gain, presenting potential for their use as laser materials (Banin et al., Adv. Mater., (2002) 14, 317). Single nanorods were also shown to exhibit a unique behavior under external electric fields—the emission can be switched on and off reversibly (Banin et. al., Nano Letters., (2005) 5, 1581).

"Nanocrystals" as used herein are crystalline particles with a diameter of <100 nm, preferably ≤95 nm, more preferably ≤90 nm, even more preferably ≤85 nm, even more preferably ≤80 nm, even more preferably 75 nm, even more preferably ≤70 nm, even more preferably ≤65 nm, even more preferably ≤60 nm, even more preferably ≤55 nm, even more preferably ≤50 nm, even more preferably ≤45 nm, even more preferably 40 nm, even more preferably ≤35 nm, even more preferably ≤30 nm, even more preferably ≤25 nm, even more preferably ≤20 nm, even more preferably ≤15 nm, and most preferably ≤10 nm.

The term "polymer" includes, but is not limited to, homopolymers, copolymers, for example, block, random, and alternating copolymers, terpolymers, quaterpolymers, etc., and blends and modifications thereof. Furthermore, unless otherwise specifically limited, the term "polymer" shall include all possible configurational isomers of the material. These configurations include, but are not limited to isotactic, syndiotactic, and atactic symmetries. A polymer is a molecule of high relative molecular mass, the structure of which essentially comprises the multiple repetition of units (i.e. repeating units) derived, actually or conceptually, from molecules of low relative mass (i.e. monomers).

The term "monomer" as used herein refers to a molecule which can undergo polymerization thereby contributing constitutional units (repeating units) to the essential structure of a polymer.

The term "homopolymer" as used herein stands for a polymer derived from one species of (real, implicit or hypothetical) monomer.

The term "copolymer" as used herein generally means any polymer derived from more than one species of monomer, wherein the polymer contains more than one species of corresponding repeating unit. In one embodiment the copolymer is the reaction product of two or more species of monomer and thus comprises two or more species of corresponding repeating unit. It is preferred that the copolymer comprises two, three, four, five or six species of repeating unit. Copolymers that are obtained by copolymerization of three monomer species can also be referred to as terpolymers. Copolymers that are obtained by copolymerization of four monomer species can also be referred to as quaterpolymers. Copolymers may be present as block, random, and/or alternating copolymers.

The term "block copolymer" as used herein stands for a copolymer, wherein adjacent blocks are constitutionally different, i.e. adjacent blocks comprise repeating units derived from different species of monomer or from the same species of monomer but with a different composition or sequence distribution of repeating units.

Further, the term "random copolymer" as used herein refers to a polymer formed of macromolecules in which the probability of finding a given repeating unit at any given site in the chain is independent of the nature of the adjacent repeating units. Usually, in a random copolymer, the sequence distribution of repeating units follows Bernoullian statistics.

The term "alternating copolymer" as used herein stands for a copolymer consisting of macromolecules comprising two species of repeating units in alternating sequence.

For the purposes of the present application the term "organyl" is used to denote any organic substituent group, regardless of functional type, having one free valence at a carbon atom.

For the purposes of the present application the term "organoheteryl" is used to denote any univalent group containing carbon, which is thus organic, but which has the free valence at an atom other than carbon being a heteroatom.

As used herein, the term "heteroatom" will be understood to mean an atom in an organic compound that is not a H- or C-atom, and preferably will be understood to mean N, O, S, P, Si, Se, As, Te or Ge.

An organyl or organoheteryl group comprising a chain of 3 or more C atoms may be straight-chain, branched and/or cyclic, including spiro and/or fused rings.

Preferred organyl and organoheteryl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more heteroatoms, preferably selected from N, O, S, P, Si, Se, As, Te and Ge.

The organyl or organoheteryl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ organyl or organoheteryl group is acyclic, the group may be straight-chain or branched. The $C_1$-$C_{40}$ organyl or organoheteryl group includes for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{23}$ allyl group, a $C_4$-$C_{23}$ alkyldienyl group, a $C_2$-$C_{23}$ ketone group, a $C_2$-$C_{23}$ ester group, a $C_6$-$C_{12}$ aryl group, and a $C_4$-$C_{23}$ polyenyl group, respectively. Also included are combinations of groups having carbon atoms and groups having heteroatoms, such as e.g. an alkynyl group, preferably ethynyl, that is substituted with a silyl group, preferably a trialkylsilyl group.

The terms "aryl" and "heteroaryl" as used herein preferably mean a mono-, bi- or tricyclic aromatic or heteroaromatic group with 4 to 30 ring C atoms that may also comprise condensed rings and is optionally substituted with one or more groups L, wherein L is selected from halogen, —CN, —NC, —NCO, —NCS, —OCN, —SCN, —C(=O)NR$^0$R$^{00}$, —C(=O)X$^0$, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or organyl or organoheteryl with 1 to 40 C atoms that is optionally substituted and optionally comprises one or more heteroatoms, and is preferably alkyl, alkoxy, thiaalkyl, alkylcarbonyl, alkoxycarbonyl or alkoxycarbonyloxy with 1 to 20 C atoms that is optionally fluorinated, and R$^0$, R$^{00}$, X$^0$ have the meanings given above and below.

Very preferred substituents L are selected from halogen, most preferably F, or alkyl, alkoxy, oxaalkyl, thioalkyl, fluoroalkyl and fluoroalkoxy with 1 to 12 C atoms or alkenyl, and alkynyl with 2 to 12 C atoms.

Especially preferred aryl and heteroaryl groups are phenyl, phenyl wherein one or more CH groups are replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b;4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, all of which can be unsubstituted, mono- or polysubstituted with L as defined above. Further examples of aryl and heteroaryl groups are those selected from the groups shown hereinafter.

An alkyl or alkoxy radical, i.e. where the terminal $CH_2$ group is replaced by —O—, can be straight-chain or branched. It is preferably straight-chain (or linear). Suitable examples of such alkyl and alkoxy radical are methyl, ethyl, propyl, butyl, pentyl, hexyl, heptyl, octyl, nonyl, decyl, undecyl, dodecyl, tridecyl, tetradecyl, pentadecyl, methoxy, ethoxy, propoxy, butoxy, pentoxy, hexoxy, heptoxy, octoxy, nonoxy, decoxy, undecoxy, dodecoxy, tridecoxy or tetradecoxy. Preferred alkyl and alkoxy radicals have 1, 2, 3, 4, 5, 6, 7, 8, 9 or 10 carbon atoms. Suitable examples of such preferred alkyl and alkoxy radicals may be selected from the group consisting of methyl, ethyl, propyl, butyl, pentyl, hexyl, heptyl, octyl, nonyl, decyl, methoxy, ethoxy, propoxy, butoxy, pentoxy, hexoxy, heptoxy, octoxy, nonoxy and decoxy.

An alkenyl group, wherein one or more $CH_2$ groups are replaced by —CH=CH— can be straight-chain or branched. It is preferably straight-chain, has 2 to 10 C atoms and accordingly is preferably vinyl, prop-1-enyl, or prop-2-enyl, but-1-enyl, but-2-enyl or but-3-enyl, pent-1-enyl, pent-2-enyl, pent-3-enyl or pent-4-enyl, hex-1-enyl, hex-2-enyl, hex-3-enyl, hex-4-enyl or hex-5-enyl, hept-1-enyl, hept-2-enyl, hept-3-enyl, hept-4-enyl, hept-5-enyl or hept-6-enyl, oct-1-enyl, oct-2-enyl, oct-3-enyl, oct-4-enyl, oct-5-enyl, oct-6-enyl or oct-7-enyl, non-1-enyl, non-2-enyl, non-3-enyl, non-4-enyl, non-5-enyl, non-6-enyl, non-7-enyl or non-8-enyl, dec-1-enyl, dec-2-enyl, dec-3-enyl, dec-4-enyl, dec-5-enyl, dec-6-enyl, dec-7-enyl, dec-8-enyl or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Alkenyl groups having up to 5 C atoms are generally preferred.

An oxaalkyl group, i.e. where one $CH_2$ group is replaced by —O—, is preferably straight-chain 2-oxapropyl (=methoxymethyl), 2-(ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. Oxaalkyl, i.e. where one $CH_2$ group is replaced by —O—, is preferably straight-chain 2-oxapropyl (=methoxymethyl), 2- (=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one $CH_2$ group is replaced by —O— and one by —C(O)—, these radicals are preferably neighboured. Accordingly these radicals together form a carbonyloxy group —C(O)—O— or an oxycarbonyl group —O—C(O)—. Preferably this group is straight-chain and has 2 to 6 C atoms. It is accordingly preferably selected from the group consisting of acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxy-carbonylmethyl, propoxycarbonylmethyl, butoxy-carbonylmethyl, 2-(methoxycarbonyl)ethyl, 2-(ethoxycarbonyl)ethyl, 2-(propoxy-carbonyl)ethyl, 3-(methoxycarbonyl)propyl, 3-(ethoxycarbonyl)propyl, and 4-(methoxycarbonyl)-butyl.

An alkyl group wherein two or more $CH_2$ groups are replaced by —O— and/or —C(O)O— can be straight-chain or branched. It is preferably straight-chain and has 3 to 12 C atoms. Accordingly it is preferably selected from the group consisting of bis-carboxy-methyl, 2,2-bis-carboxy-ethyl, 3,3-bis-carboxy-propyl, 4,4-bis-carboxy-butyl, 5,5-bis-carboxy-pentyl, 6,6-bis-carboxy-hexyl, 7,7-bis-carboxy-heptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2-bis-(ethoxycarbonyl)-ethyl, 3,3-bis-(ethoxycarbonyl)-propyl, 4,4-bis-(ethoxycarbonyl)-butyl, and 5,5-bis-(ethoxycarbonyl)-hexyl.

A thioalkyl group, i.e. where one $CH_2$ group is replaced by —S—, is preferably straight-chain thiomethyl (—$SCH_3$), 1-thioethyl (—$SCH_2CH_3$), 1-thiopropyl (=—$SCH_2$ $CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

A fluoroalkyl group is preferably perfluoroalkyl, $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethylhexoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-meth-oxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert-butyl, isopropoxy, 2-methyl-propoxy and 3-methylbutoxy.

In a preferred embodiment, the organyl and organoheteryl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

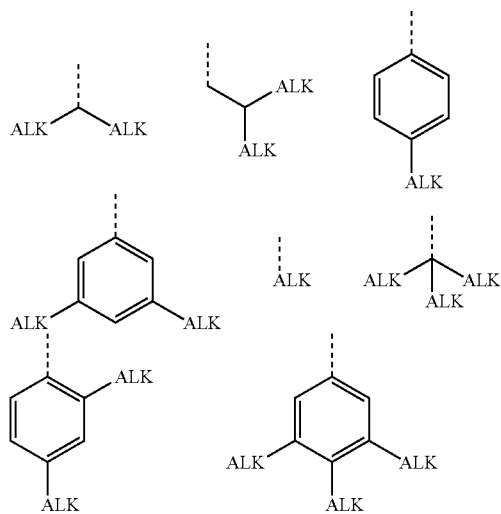

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

—$CY^1$=$CY^2$— is preferably —CH=CH—, —CF=CF— or —CH=C(CN)—.

As used herein, "halogen" includes F, Cl, Br or I, preferably F, Cl or Br.

For the purposes of the present application the term "substituted" is used to denote that one or more hydrogen present is replaced by a group $R^S$ as defined herein.

$R^S$ is at each occurrence independently selected from the group consisting of any group $R^T$ as defined herein, organyl or organoheteryl having from 1 to 40 carbon atoms wherein the organyl or organoheteryl may be further substituted with one or more groups $R^T$ and organyl or organoheteryl having from 1 to 40 carbon atoms comprising one or more heteroatoms selected from the group consisting of N, O, S, P, Si, Se, As, Te or Ge, with N, O and S being preferred heteroatoms, wherein the organyl or organoheteryl may be further substituted with one or more groups $R^T$.

Preferred examples of organyl or organoheteryl suitable as $R^S$ may at each occurrence be independently selected from phenyl, phenyl substituted with one or more groups $R^T$, alkyl and alkyl substituted with one or more groups $R^T$, wherein the alkyl has at least 1, preferably at least 5, more preferably at least 10 and most preferably at least 15 carbon atoms and/or has at most 40, more preferably at most 30, even more preferably at most 25 and most preferably at most 20 carbon atoms. It is noted that for example alkyl suitable as $R^S$ also includes fluorinated alkyl, i.e. alkyl wherein one or more hydrogen is replaced by fluorine, and perfluorinated alkyl, i.e. alkyl wherein all of the hydrogen are replaced by fluorine.

$R^T$ is at each occurrence independently selected from the group consisting of F, Br, Cl, —CN, —NC, —NCO, —NCS, —OCN, —SCN, —C(O)$NR^0R^{00}$, —C(O)$X^0$, —C(O)$R^0$, —$NH_2$, —$NR^0R^{00}$, —SH, —$SR^0$, —$SO_3H$, —$SO_2R^0$, —OH, —$OR^0$, —$NO_2$, —$SF_5$ and —$SiR^0R^{00}R^{000}$. Preferred $R^T$ are selected from the group consisting of F, Br, Cl, —CN, —NC, —NCO, —NCS, —OCN, —SCN, —C(O)$NR^0R^{00}$, —C(O)$X^0$, —C(O)$R^0$, —$NH_2$, —$NR^0R^{00}$, —SH, —$SR^0$, —OH, —$OR^0$ and —$SiR^0R^{00}R^{000}$.

$R^0$, $R^{00}$ and $R^{000}$ are at each occurrence independently of each other selected from the group consisting of H, F, organyl or organoheteryl having from 1 to 40 carbon atoms. Said organyl or organoheteryl preferably have at least 5, more preferably at least 10 and most preferably at least 15 carbon atoms. Said organyl or organoheteryl preferably have at most 30, even more preferably at most 25 and most preferably at most 20 carbon atoms. Preferably, $R^0$, $R^{00}$ and $R^{000}$ are at each occurrence independently of each other selected from the group consisting of H, F, alkyl, fluorinated alkyl, alkenyl, alkynyl, phenyl and fluorinated phenyl. More preferably, $R^0$, $R^{00}$ and $R^{000}$ are at each occurrence independently of each other selected from the group consisting of H, F, alkyl, fluorinated, preferably perfluorinated, alkyl, phenyl and fluorinated, preferably perfluorinated, phenyl.

It is noted that for example alkyl suitable as $R^0$, $R^{00}$ and $R^{000}$ also includes perfluorinated alkyl, i.e. alkyl wherein all of the hydrogen are replaced by fluorine. Examples of alkyls may be selected from the group consisting of methyl, ethyl, n-propyl, iso-propyl, n-butyl, iso-butyl, tert-butyl (or "t-butyl"), pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl (—$C_{20}H_{41}$).

$X^0$ is halogen. Preferably $X^0$ is selected from the group consisting of F, Cl and Br.

The present application is directed to a formulation comprising a polymer containing a first repeating unit $M^1$ and a second repeating unit $M^2$; and a surface-modified zirconium dioxide nanocrystal.

In a preferred embodiment the polymer comprises at least one further repeating unit $M^1$ which is different from the first repeating unit $M^1$. If the polymer comprises more than one further repeating unit $M^1$, such further repeating units $M^1$ are mutually different from each other. More preferably, the polymer comprises two, three or four further repeating units $M^1$ which are different from the first repeating unit $M^1$ and which are mutually different from each other.

In a preferred embodiment the polymer comprises at least one further repeating unit $M^2$ which is different from the second repeating unit $M^2$. If the polymer comprises more than one further repeating unit $M^2$, such further repeating units $M^2$ are mutually different from each other. More preferably, the polymer comprises two, three or four further repeating units $M^2$ which are different from the second repeating unit $M^2$ and which are mutually different from each other.

In a more preferred embodiment the polymer comprises at least one further repeating unit $M^1$ and at least one further repeating unit $M^2$ as defined above.

Preferably, the polymer is a copolymer such as a random copolymer or a block copolymer or a copolymer containing at least one random sequence section and at least one block sequence section. More preferably, the polymer is a random copolymer or a block copolymer.

Said first repeating unit $M^1$ is represented by formula (I):

$$—[—SiR^1R^2—NR^5—]—  \quad (I)$$

wherein $R^1$, $R^2$ and $R^5$ are as defined herein.

Said second repeating unit $M^2$ is represented by formula (II):

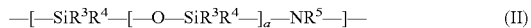
$$—[—SiR^3R^4—[—O—SiR^3R^4—]_a—NR^5—]— \quad (II)$$

wherein $R^3$, $R^4$ and $R^5$ and the index "a" are as defined herein.

Said further repeating unit $M^1$ is represented by formula (I), wherein the further repeating unit $M^1$ is different from the first repeating unit $M^1$.

a is an integer from 1 to 60, preferably an integer from 1 to 50. More preferably, a may be an integer from 40 to 50 (long chain monomer $M^2$), even more preferably any one of the group consisting of 40, 41, 42, 43, 44, 45, 46, 47, 48, 49 and 50, or a may be an integer from 1 to 4 (short chain monomer $M^2$), even more preferably any one of the group consisting of 1, 2, 3 and 4.

$R^1$, $R^2$, $R^3$, $R^4$ and $R^5$ are at each occurrence independently from each other selected from the group consisting of hydrogen, organyl and organoheteryl.

Preferred organyl groups may at each occurrence independently be selected from the group consisting of alkyl, substituted alkyl, cycloalkyl, substituted cycloalkyl, alkenyl, substituted alkenyl, alkadienyl, substituted alkadienyl, alkinyl, substituted alkinyl, aryl, and substituted aryl.

More preferred organyl groups may at each occurrence independently be selected from the group consisting of alkyl, substituted alkyl, cycloalkyl, substituted cycloalkyl, alkenyl, substituted alkenyl, alkadienyl and substituted alkadienyl.

Even more preferred organyl groups may at each occurrence independently be selected from the group consisting of alkyl, substituted alkyl, alkenyl, substituted alkenyl, alkadienyl and substituted alkadienyl.

Still even more preferred organyl groups may at each occurrence independently be selected from the group consisting of alkyl and substituted alkyl.

Most preferred organyl groups may at each occurrence independently be selected from the group consisting of alkyl.

Preferred alkyl may be selected from alkyls having at least 1 carbon atom and at most 40 carbon atoms, preferably at most 30 or 20 carbon atoms, more preferably at most 15 carbon atoms, still even more preferably at most 10 carbon atoms and most preferably at most 5 carbon atoms.

Alkyl having at least 1 carbon atom and at most 5 carbon atoms may, for example, independently be selected from the group consisting of methyl, ethyl, n-propyl, iso-propyl, n-butyl, iso-butyl, tert-butyl, n-pentyl, iso-pentyl (2,2-methyl-butyl) and neo-pentyl (2,2-dimethyl-propyl); preferably from the group consisting of methyl, ethyl, n-propyl and iso-propyl; more preferably is methyl or ethyl; and most preferably is methyl.

Preferred cycloalkyl may be selected from cycloalkyl having at least 3, preferably at least 4 and most preferably at least 5 carbon atoms. With respect to $R^1$ and $R^2$ preferred cycloalkyl may be selected from cycloalkyl having at most 30, preferably at most 25, more preferably at most 20, even more preferably at most 15, and most preferably at most 10 carbon atoms.

Preferred examples of cycloalkyl may be selected from the group consisting of cyclopentyl, cyclohexyl, cycloheptyl and cyclooctyl.

Preferred alkenyl may be selected from alkenyl having at least 2 carbon atoms and at most 20, more preferably at most 15, even more preferably at most 10, and most preferably at most 6 carbon atoms. Said alkenyl may comprise the C=C double bond at any position within the molecule; for example, the C=C double bond may be terminal or non-terminal.

Alkenyl having at least 2 and at most 10 carbon atoms may be vinyl or allyl, preferably vinyl.

Preferred alkadienyl may be selected from alkadienyl having at least 4 and at most 20, more preferably at most 15, even more preferably at most 10, and most preferably at most 6 carbon atoms. Said alkenyl may comprise the two C=C double bonds at any position within the molecule, provided that the two C=C double bonds are not adjacent to each other; for example, the C=C double bonds may be terminal or non-terminal.

Alkadienyl having at least 4 and at most 6 carbon atoms may, for example, be butadiene or hexadiene.

Preferred aryl may be selected from aryl having at least 6 carbon atoms, and at most 30, preferably at most 24 carbon atoms.

Preferred examples of aryl may be selected from the group consisting of phenyl, naphthyl, phenanthrenyl, anthracenyl, tetracenyl, benz[a]anthracenyl, pentacenyl, chrysenyl, benzo[a]pyrenyl, azulenyl, perylenyl, indenyl, fluorenyl and any of these wherein one or more (for example 2, 3 or 4) CH groups are replaced by N. Of these phenyl, naphthyl and any of these wherein one or more (for example 2, 3 or 4) CH groups are replaced by N. Phenyl is most preferred.

In a preferred embodiment, $R^1$ and $R^2$ are at each occurrence independently from each other hydrogen or alkyl having 1 to 20 carbon atoms or phenyl.

In a more preferred embodiment, $R^1$ and $R^2$ are at each occurrence independently from each other hydrogen or methyl.

In a preferred embodiment, $R^3$ and $R^4$ are independently from each other hydrogen or alkyl having 1 to 40 carbon atoms or phenyl.

In a more preferred embodiment, $R^3$ and $R^4$ are independently from each other methyl or phenyl.

In a preferred embodiment, $R^5$ is at each occurrence independently hydrogen or alkyl having 1 to 20 carbon atoms or phenyl.

In a more preferred embodiment, $R^5$ is at each occurrence independently hydrogen or methyl.

It is understood that the skilled person can freely combine the above-mentioned preferred and more preferred embodiments relating to the substituents $R^1$, $R^2$, $R^3$, $R^4$ and $R^5$ in the polymer comprising the first repeating unit $U^1$ and the second repeating unit $U^2$ in any desired way.

Preferably, the polymers used in the present invention have a molecular weight $M_w$, as determined by GPC, of at least 1,000 g/mol, more preferably of at least 2,000 g/mol, even more preferably of at least 3,000 g/mol. Preferably, the molecular weight $M_w$ of the polymers is less than 100,000 g/mol. More preferably, the molecular weight $M_w$ of the polymers is in the range from 3,000 to 50,000 g/mol.

If necessary, the molecular weight of the polymers may be modified, preferably increased, by fluoride-catalyzed crosslinking or by base-catalyzed crosslinking. These methods are well known to the skilled person.

The present polymers are characterized by an excellent temperature resistance and/or longevity as compared to currently used standard materials, such as phenylsilicone or organopolysilazanes.

The surface-modified zirconium dioxide nanocrystal which is used in the formulation according to the present invention may be surface-modified with a silicone capping agent.

Figure 1:
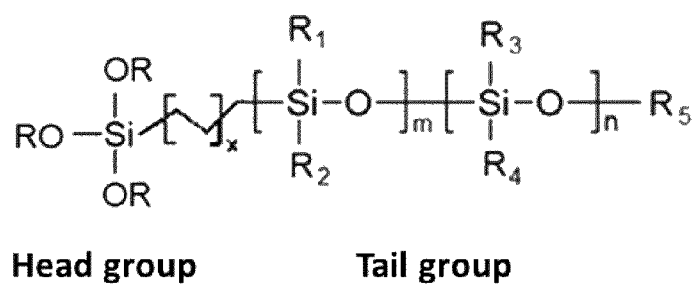
FIG. 1 shows the silicone capping agent where the head group is an alkoxysilane, the tail group of the capping agent comprises a silicone polymer (silicone chain), and a linker is used to connect the tail group to the head group.

An exemplary non-limiting process of capping $ZrO_2$ nanocrystals with more than one type of capping agent is described herein: as synthesized $ZrO_2$ nanocrystals are rinsed with a nonpolar solvent or polar solvent. The as synthesized $ZrO_2$ nanocrystals can be rinsed 0, 1, 2, or 3 times. Rinse solvents can include nonpolar solvents, such as toluene or heptanes, or polar solvents, such as PGMEA or THF. The rinsed as synthesized $ZrO_2$ nanocrystals are suspended in a nonpolar solvent at 1 to 5%, 5% to 10%, 10% to 15%, 15 to 20%, 20 to 25%, 25 to 30%, 30 to 35%, 35 to 40%, 40 to 45%, 45 to 50%, 50 to 55%, 55 to 60%, 60 to 65%, 65 to 70%, 70 to 75%, or 75 to 80% by weight of $ZrO_2$ nanocrystals. Other nonpolar solvents, such as benzene and xylene, can be used. The head group in the capping agent shown in FIG. 1 is an alkoxysilane that is capable of attaching to the surface of the $ZrO_2$ nanocrystals. The tail group of the capping agent comprises a silicone polymer (silicone chain) wherein groups $R_1$, $R_2$, $R_3$, and $R_4$, independently comprise an alkyl, aryl, poly aryl or alkenyl groups. The groups $R_1$, $R_2$, $R_3$, and $R_4$ may have an arrangement to form alternating, random, or block polymers. In FIG. 1 the values for 'm' and 'n' independently can have a range between 0 to 60. $R_5$ may be an end group such as $Si(CH_3)_3$, $Si(CH_3)_2H$, $Si(CH_3)_2(CHCH_2)$, or $Si(CH_3)_2(C_4H_9)$. A linker is used to connect the tail group to the head group, comprised of an alkyl group. In FIG. 1 the value for "x" can have a range between 0 and 8.

More specifically, the head group may comprise a trimethoxysilyl group and the tail group may comprise a dimethyl silicone, methyl phenyl silicone, or combination of both. An exemplary capping agent may comprise $(MeO)_3Si—(CH_2)_x—((Si(R_5,R_6)_2O)_m—Si(Me_2)C_4H_9$ with $R_5$ and $R_6$ being independently methyl or phenyl. The capping agent may have linear or branched structure with the value for 'm' varying in the range of 1-100, preferably 2-15; x=0-8, preferably 2-3. The $ZrO_2$ nanocrystals comprising silicone capping agents may optionally also comprise one or more of capping agent comprised of functional capping agents, such as vinyltrimethoxysilane, allyltrimethoxysilane, 1-hexenyltrimethoxysilane, 1-octenyltrimethoxysilane, or non-functional capping agents, such as methyltrimethoxysilane, ethyltrimethoxysilane, propyltrimethoxysilane, propyltriethoxysilane, n-octyltrimethoxysilane, n-octyltriethoxysilane, n-dodecyltrimethoxysilane, n-dodecyltriethoxysilane, n-hexadecyltrimethoxysilane, or octadecyltrimethoxysilane. Functional capping agents comprise reactive chemical groups, such as vinyl and allyl groups, which can undergo additional chemical reactions.

Figure 2:
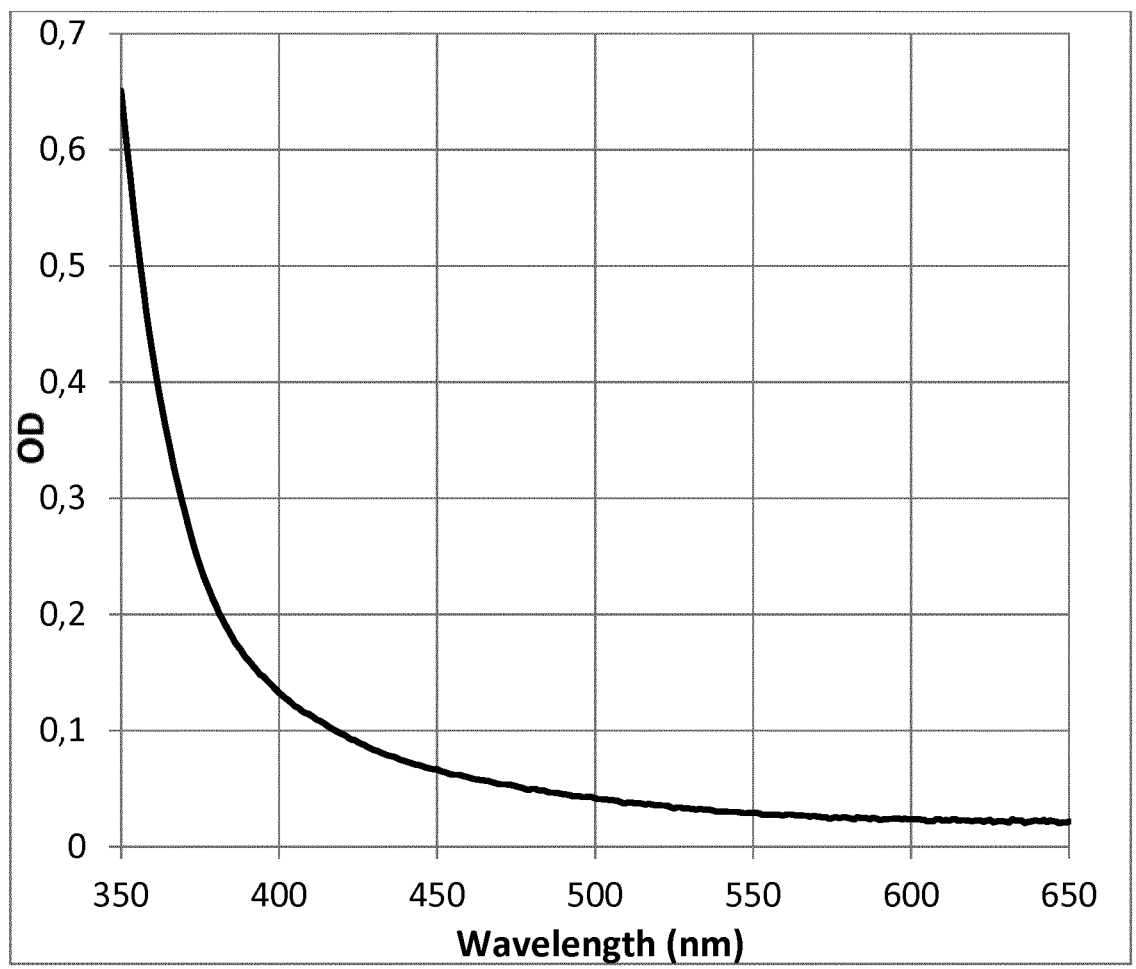
FIG. 2 shows the UV-Vis spectrum of the surface-modified silicone capped $ZrO_2$ dispersed in xylene.
Figure 3:
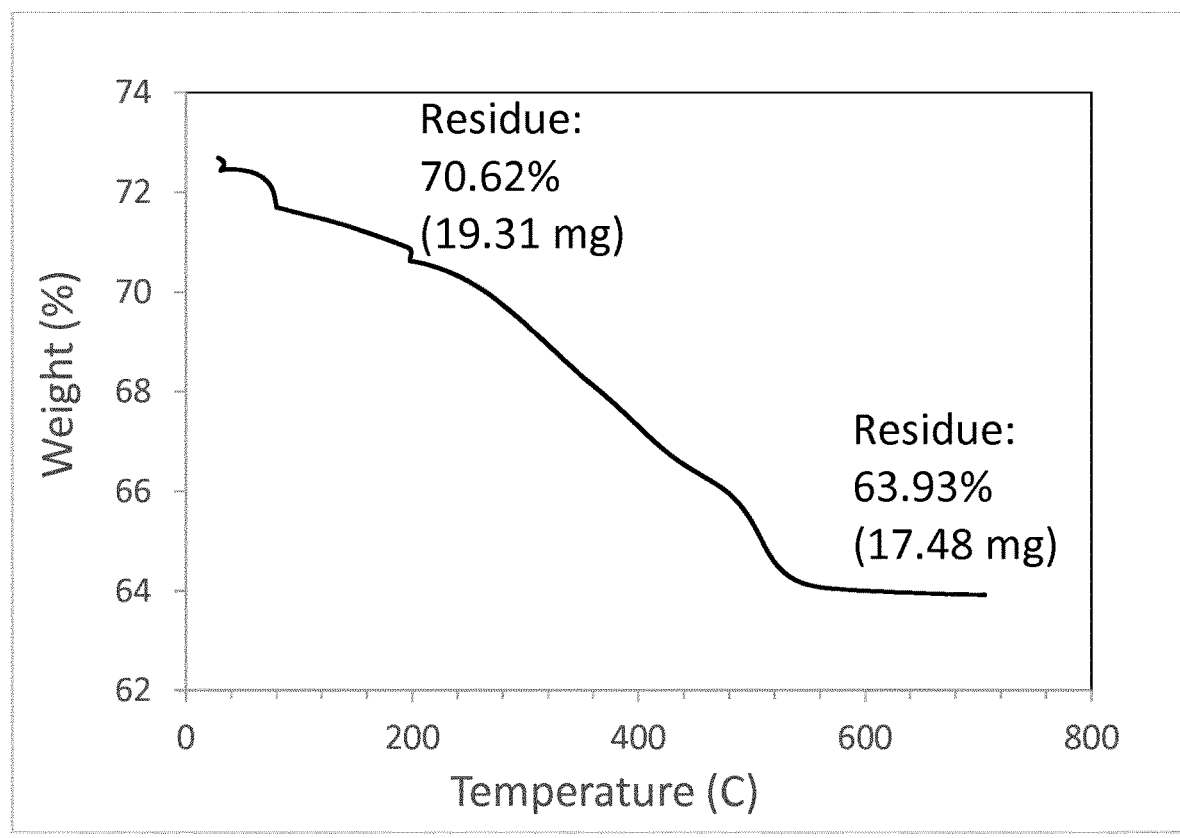
FIG. 3 shows the TGA spectrum of the surface-modified silicone capped $ZrO_2$.
Figure 4:
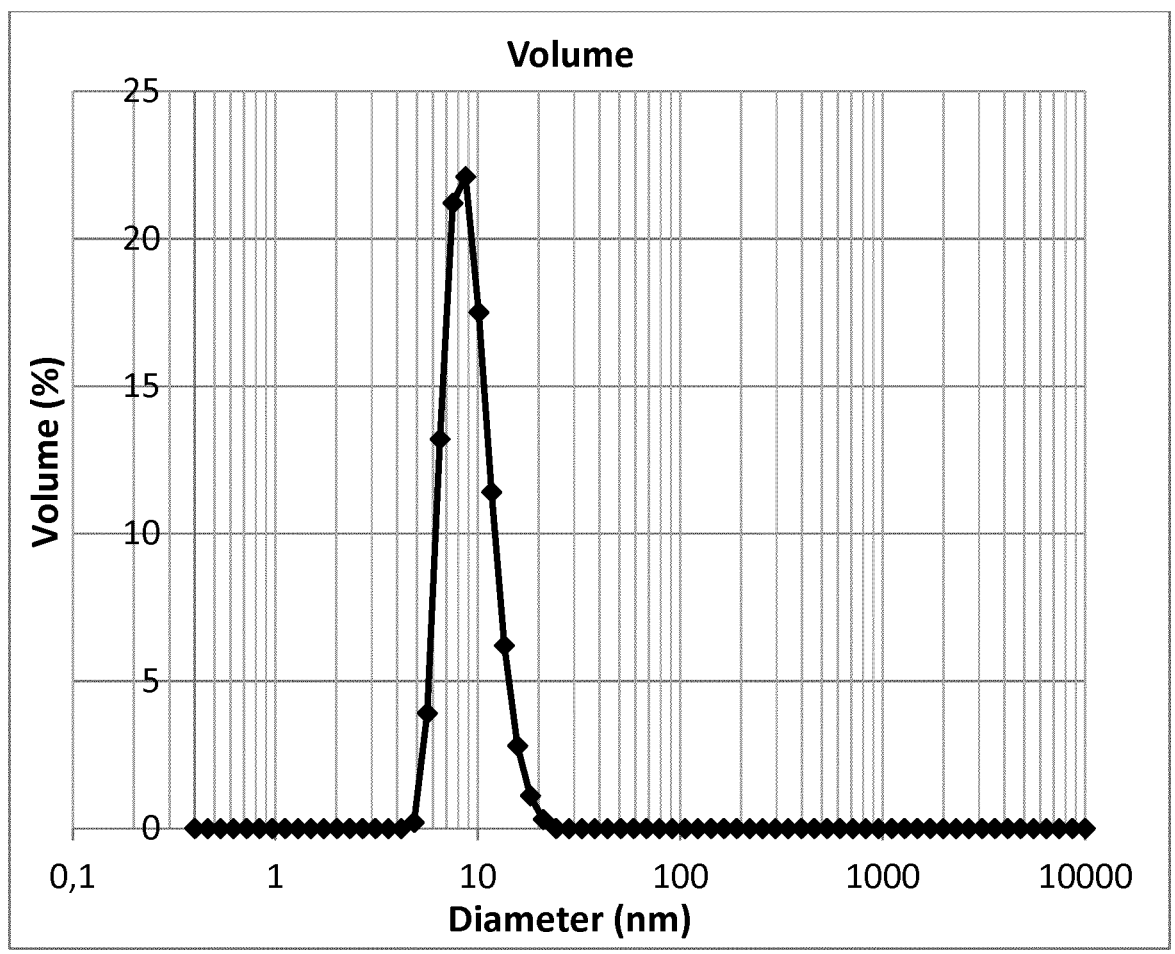
FIG. 4 shows the size distribution of the surface-modified silicone capped $ZrO_2$ is measured with dynamic light scattering instrument.

The silicone capping agent is added to the suspension at optionally 1 to 5%, 5 to 10%, 10 to 15%, 15 to 20%, 20 to 25% 25 to 30%, 30 to 35%, 35 to 40%, 40 to 45%, 45 to 50%, 50 to 55%, or 55 to 60% by weight of the $ZrO_2$ nanocrystals. The solution is heated between 60 to 70° C., 70 to 80° C., 80 to 90° C., 90 to 100° C., 100 to 110° C., or 110 to 120° C. for 1 to 10 minutes, 10 to 20 minutes, 20 to 30 minutes, 30 to 40 minutes, 40 to 50 minutes, or 50 to 60 minutes; this process is followed by addition of a second type of capping agent with alkyl groups to the reaction mixture. The amount of the second type of capping agents is added to the suspension at optionally 0 to 5%, 5 to 10%, 10 to 15%, 15 to 20%, 20 to 25%, 25 to 30%, 30 to 35%, 35 to 40%, 40 to 45%, 45 to 50%, 50 to 55%, or 55 to 60% by weight of the $ZrO_2$ nanocrystals. The solution is heated between 60 to 70° C., 70 to 80° C., 80 to 90° C., 90 to 100° C., 100 to 110° C., or 110 to 120° C. for 1 to 10 minutes, 10 to 20 minutes, 20 to 30 minutes, 30 to 40 minutes, 40 to 50 minutes, or 50 to 60 minutes. The capped $ZrO_2$ nanocrystals are then purified by precipitating capped $ZrO_2$ nanocrystals with a polar solvent, such as ethanol, methanol, and re-dispersing the nanocrystals in a non-polar solvent, such as toluene, hexanes, heptanes; and finally centrifuging and removing the solvents by and dried under vacuum. The dried surface-modified silicone capped $ZrO_2$ nanocrystals are dispersed into a solvent to create a dispersion. Preferably, said solvent may optionally also comprise one or more solvents comprised of non-polar solvents or polar non-protic solvents, preferably organic solvent. Preferred examples of suitable solvents may be selected from the group consisting of ethers, cyclic ethers, ketones, esters, mixed ether/ester solvents, hydrocarbons, aromatic solvents and any mixture of any of these. Preferred examples of ethers are 1-methoxy-2-propyl acetate and di-n-butylether (DBE). A preferred example of a cyclic ether is tetrahydrofuran (THF). Preferred examples of esters are ethyl-acetate and n-butyl-acetate. Preferred examples of hydrocarbons are pentane, hexane, heptane, octane, nonane, decane, and cyclohexane. A preferred example of an aromatic solvent may be selected from the group consisting of benzene, toluene, ortho-xylene, meta-xylene, para-xylene and any mixture of any of these. The surface-modified silicone capped $ZrO_2$ nanocrystals are dispersed in the solvent at 1 to 5%, 5% to 10%, 10% to 15%, 15 to 20%, 20 to 25%, 25 to 30%, 30 to 35%, 35 to 40%, 40 to 45%, 45 to 50%, 50 to 55%, 55 to 60%, 60 to 65%, 65 to 70%, 70 to 75%, 75 to 80%, 80 to 85%, 85 to 90%, 90 to 95%, or 95 to 99% by weight of $ZrO_2$ nanocrystals. The solvent(s) used in the formulation are chosen or modified such that they fit to the respective application method which is used to apply the formulation of the invention to an LED. FIG. 2 shows the UV-Vis spectrum of the surface-modified silicone capped $ZrO_2$ dispersed in xylene with 70.62 wt % loading. The organic content for the surface-modified silicone capped $ZrO_2$ is 9.47%, which is calculated by equation 1 with TGA data:

$$\text{Organic content} = (1 - (\% \text{ Mass at 700 C}/\% \text{ Mass at 200 C})) * 100\% \quad \text{Equation 1}$$

as shown in FIG. 3. The size distribution of the surface-modified silicone capped $ZrO_2$ is measured with dynamic light scattering instrument, Zetasizer (Nano-S-Zen 1600), as shown in FIG. 4.

In a preferred embodiment the formulation of the present invention may further contain one or more solvents. The solvent comprised in said formulation comprising the polymer and the surface-modified zirconium dioxide nanocrystal is not particularly limited provided that the components of said formulation have a sufficient solubility therein. Preferably, said solvent may be a non-polar or polar non-protic, preferably organic solvent.

Preferred examples of suitable solvents may be selected from the group consisting of ethers, cyclic ethers, ketones, esters, mixed ether/ester solvents, hydrocarbons, aromatic solvents and any mixture of any of these.

Preferred examples of ethers are methyl-tert-butylether, di-ethylether, methyl-isobutylether, methyl-isopropylether, di-n-propylether, di-isopropylether, methyl-cyclopentylether, all isomers of di-butyl- and di-pentylether and polyethers like ethylenglycol-dimethylether, ethylenglycol-diethylether, propylenglycol-dimethylether, propylenglycol-diethylether, diethylenglycol-dimethyl ether and dipropylenglycol-dimethyl ether.

Preferred examples of cyclic ethers are tetrahydrofuran (THF), 2-methyl-tetrahydrofuran, 1,3-dioxolan, tetrahydropyran and 1,4-dioxan.

Preferred examples of ketones are acetone, methyl-ethyl-ketone, methyl-isobutyl-ketone, 2- or 3-, n- or iso-pentanon, cyclopentanone, cyclohexanone, n- or iso-, 2- or 3-hexanone, n- or iso-, 2-, 3- or 4-heptanone.

Preferred examples of esters are methyl-acetate, ethyl-acetate, propyl-acetate, n-butyl-acetate, iso-butyl-acetate, tert-butyl acetate, adipic acid dimethyl ester, methyl-benzoate, dimethylsuccinate and cyclic esters like γ-butyrolactone and γ- or ε-valerolactone.

Preferred examples of mixed ether/ester solvents are 2-methoxy-propyl acetate (PGMEA), butyl glycol acetate, ethylenglycol-methylether-acetat and ethylenglycol-ethylether-acetat.

Preferred examples of hydrocarbons are linear hydrocarbons like pentane, hexane, heptane, octane, nonane, decane and the branched isomers like for example iso-octane and cyclic hydrocarbons like cyclopentane, cyclo hexane and decalin and mixtures for example known under the trivial names benzine, petrolether, white spirit and mineral spirit available for example under the trade names Shellsol® and Isopar®.

Preferred examples of aromatic solvents may be selected from the group consisting of benzene, toluene, ortho-xylene, meta-xylene, para-xylene, chloro benzene, dichloro benzene, anisol and methyl anisol and any mixture of any of these.

The solvent(s) used in the formulation are chosen or modified such that they fit to the respective application method which is used to apply the formulation of the invention to an LED.

Preferably, the total content of the polymer and the surface-modified zirconium dioxide nanocrystal in the formulation is in the range from 1 to 5%, 5% to 10%, 10% to 15%, 15 to 20%, 20 to 25%, 25 to 30%, 30 to 35%, 35 to 40%, 40 to 45%, 45 to 50%, 50 to 55%, 55 to 60%, 60 to 65%, 65 to 70%, 70 to 75%, 75 to 80%, 80 to 85%, 85 to 90%, 90 to 95%, or 95 to 99.9% weight % depending on the respective application method which is used for applying the formulation of the present application to an LED. The formulation of the invention may be applied by any known application method such as, for example, dispensing, screen printing, stencil printing, spray coating, slot coating and other methods such as spin coating and ink-jet printing.

For example, it is preferred that the total content of the polymer and the surface-modified zirconium dioxide nanocrystal is in the range from 5 to 30 weight %, more preferably from 5 to 25 weight % and most preferably from 5 to 20 weight %, if spray coating is used.

For example, if spray coating is used, a preferred solvent system comprises a solvent A) with a boiling point of <90° C. and a solvent B) with a boiling point of >90° C. The low boiling solvent A) is preferably an ester, an ether and/or a ketone solvent and the high boiling solvent B) is preferably an ester, an ether, an alkane and/or an aromatic solvent.

Furthermore, a method for preparing a formulation of the present invention is provided, wherein the polymer containing a first repeating unit $M^1$ and a second repeating unit $M^2$ as defined above is mixed with a dispersion of surface-modified zirconium dioxide nanocrystal. In said dispersion the surface-modified zirconium dioxide nanocrystal is dispersed in a liquid. Preferably, the surface-modified zirconium dioxide nanocrystal is dispersed in a liquid selected from the list consisting of ether solvents, ester solvents, aromatic solvents and alkane solvents. Preferred ether solvents are dibutyl ether (DBE) and tetrahydrofuran (THF). Preferred ester solvents are butyl acetate (BuAc). Preferred aromatic solvents are benzene, toluene and xylene. Preferred alkane solvents are pentane, hexane, heptane, octane, nonane, and decane. Furthermore, it is preferred that the polymer is provided in the form of a solution. Regarding the solvent for the polymer there are no specific restrictions as long as the solvent is able to solve the polymer in a sufficient amount. Typically, the polymer is dissolved in a solvent which is identical or similar to or at least compatible with the liquid in which the surface-modified zirconium dioxide nanocrystals are dispersed.

Preferred examples of suitable solvents may be selected from the group consisting of ethers, cyclic ethers, ketones, esters, mixed ether/ester solvents, hydrocarbons, aromatic solvents and any mixture of any of these.

Preferred examples of ethers are methyl-tert-butylether, di-ethylether, methyl-isobutylether, methy-isopropylether, di-n-propylether, di-isopropylether, methyl-cyclopentylether, all isomers of di-butyl- and di-pentylether and polyethers like ethylenglycol-dimethylether, ethylenglycol-diethylether, propylenglycol-dimethylether, propylenglycol-diethylether, diethylenglycol-dimethyl ether and dipropylenglycol-dimethyl ether.

Preferred examples of a cyclic ether are tetrahydrofuran (THF), 2-methyl-tetrahydrofuran, 1,3-dioxolan, tetrahydropyran and 1,4-dioxan.

Preferred examples of ketones are acetone, methyl-ethyl-ketone, methyl-isobutyl-ketone, 2- or 3-, n- or iso-pentanon, cyclopentanone, cyclohexanone, n- or iso-, 2- or 3-hexanone, n- or iso-, 2-, 3- or 4-heptanone.

Preferred examples of esters are methyl-acetate, ethyl-acetate, propyl-acetate, n-butyl-acetate, iso-butyl-acetate, tert-butyl acetate, adipic acid dimethyl ester, methyl-benzoate, dimethylsuccinate and cyclic esters like γ-butyrolactone and γ- or ε-valerolactone.

Preferred examples of mixed ether/ester solvents are 2-methoxy-propyl acetate (PGMEA), butyl glycol acetate, ethylenglycol-methylether-acetat and ethylenglycol-ethylether-acetat.

Preferred examples of hydrocarbons are linear hydrocarbons like pentane, hexane, heptane, octane, nonane, decan and the branched isomers like for example iso-octane and cyclic hydrocarbons like cyclopentane, cyclo hexane and decalin and mixtures for example known under the trivial names benzine, petrolether, white spirit and mineral spirit available for example under the trade names Shellsol® and Isopar®.

Preferred examples of aromatic solvents may be selected from the group consisting of benzene, toluene, ortho-xylene, meta-xylene, para-xylene, chloro benzene, dichloro benzene, anisol and methyl anisol and any mixture of any of these.

The solvent(s) used for preparing the formulation are chosen or modified such that they are suitable for the respective application method which is used to apply the formulation of the invention to an LED precursor. For example, during evaporation of the solvent and the simultaneous film formation, the dispersibility of the surface-modified zirconium dioxide nanocrystal should not decrease and no agglomeration of the material should occur, which may form particle-like structures preventing the coating from being transparent to visible light. Good coating results and reliable data are achieved by using solvents such as ethers, esters, ketones, hydrocarbons and aromatic solvents.

Preferably, the formulation may comprise one or more additives selected from the group consisting of converters, viscosity modifiers, surfactants, additives influencing film formation, additives influencing evaporation behavior and cross-linkers. Most preferably, said formulation further comprises a converter.

In a preferred embodiment a dispersion of the surface-modified zirconium dioxide nanocrystal is added to a solution of the polymer and then mixed. As an alternative to this preferred embodiment a solution of the polymer may be added to a dispersion of the surface-modified zirconium dioxide nanocrystal and then mixed.

It is preferred that the formulation of the invention is prepared at ambient temperature, i.e. 25° C., however, it may also be prepared at elevated temperatures such as e.g. 25 to 50° C.

In addition, an encapsulation material for an LED is provided, wherein the encapsulation material is obtainable by
(a) providing a formulation according to the invention; and
(b) curing said formulation at a temperature of 70 to 300° C. for a period of 1 to 24 h.

It is preferred that the curing in step (b) is carried out on a hot plate, in a furnace, or in a climate chamber.

Preferably, the curing in step (b) is carried out on a hot plate at a temperature of 100 to 280° C., more preferably from 120 to 270° C., and most preferably from 150 to 250° C.

In an alternative preferred embodiment, the curing in step (b) is carried out in a furnace at a temperature of 100 to 280° C., more preferably from 120 to 270° C., and most preferably from 150 to 250° C.

In an alternative preferred embodiment, the curing in step (b) is carried out in a climate chamber having a relative humidity in the range from 50 to 99%, more preferably from 60 to 95%, and most preferably from 80 to 90%, at a temperature of 70 to 95° C., more preferably from 80 to 90° C.

Preferably, the curing time is from 2 to 20 h, more preferably from 3 to 18 h, and most preferably from 4 to 16 h, depending on the application thickness, the monomer composition of the polymer, and the curing method.

There is further provided an LED comprising the encapsulation material of the present invention. Particular preference is given here to an LED comprising a semiconductor light source (LED chip) and at least one converter, preferably a phosphor or quantum material. The LED is preferably white-emitting or emits light having a certain colour point (colour-on-demand principle). The colour-on-demand concept is taken to mean the production of light having a certain colour point using a pc-LED (=phosphor-converted LED) using one or more phosphors.

In a preferred embodiment of the LED according to the invention, the semiconductor light source (LED chip) is a luminescent indium aluminium gallium nitride, in particular of the formula $In_iGa_jAl_kN$, where $0 \leq i$, $0 \leq j$, $0 \leq k$, and $i+j+k=1$. These can be light-emitting LED chips of various structure.

In a further preferred embodiment of the LED according to the invention, the LED is a luminescent arrangement based on ZnO, TCO (transparent conducting oxide), ZnSe or SiC.

In a further preferred embodiment of the light source according to the invention, the LED is a light source which exhibits electroluminescence and/or photoluminescence.

It is preferred that the encapsulation material of the invention is comprised in a converter layer of the LED. Preferably, the converter layer contains the encapsulation material and a converter, more preferably a phosphor and/or a quantum material. The converter layer is either arranged directly on the semiconductor light source (LED chip) or alternatively arranged remote therefrom, depending on the respective type of application (the latter arrangement also includes "remote phosphor technology"). The advantages of remote phosphor technology are known to the person skilled in the art and are revealed, for example, by the following publication: Japanese J. of Appl. Phys. Vol. 44, No. 21 (2005), L649-L651.

The optical coupling between the semiconductor light source (LED chip) and the converter layer can also be achieved by a light-conducting arrangement. This makes it possible for the semiconductor to be installed at a central location and to be optically coupled to the converter layer by means of light-conducting devices, such as, for example, optical fibres. In this way, it is possible to achieve lamps adapted to the lighting wishes which merely consist of one or various phosphors, which can be arranged to form a light screen, and an optical waveguide, which is coupled to the light source. In this way, it is possible to place a strong light source at a location which is favourable for electrical installation and to install lamps comprising phosphors which are coupled to the optical waveguides at any desired locations without further electrical cabling, but instead only by laying optical waveguides.

Preferably, the converter is a phosphor, i.e. a substance having luminescent properties. The term "luminescent" is intended to include both, phosphorescent as well as fluorescent.

For the purposes of the present application, the type of phosphor is not particularly limited. Suitable phosphors are well known to the skilled person and can easily be obtained from commercial sources. For the purposes of the present application the term "phosphor" is intended to include materials that absorb in one wavelength of the electromagnetic spectrum and emit at a different wavelength.

Examples of suitable phosphors are inorganic fluorescent materials in particle form comprising one or more emitting centers. Such emitting centers may, for example, be formed by the use of so-called activators, which are preferably atoms or ions selected from the group consisting of rare earth elements, transition metal elements, main group elements and any combination of any of these. Example of suitable rare earth elements may be selected from the group consisting of La, Ce, Pr, Nd, Pm, Sm, Eu, Gd, Tb, Dy, Ho, Er, Tm, Yb and Lu. Examples of suitable transition metal elements may be selected from the group consisting of Cr, Mn, Fe, Co, Ni, Cu, Ag, Au and Zn. Examples of suitable main group elements may be selected from the group consisting of Na, Tl, Sn, Pb, Sb and Bi. Examples of suitable phosphors include phosphors based on garnet, silicate, orthosilicate, thiogallate, sulfide, nitride, silicon-based oxynitride, nitridosilicate, nitridoaluminiumsilicate, oxonitridosilicate, oxonitridoaluminiumsilicate and rare earth doped sialon.

Suitable yellow phosphors may, for example, comprise or be based on $(Gd,Y)_3(Al, Ga)_5O_{12}$ doped with Ce, such as the commercially available cerium-doped yttrium aluminium garnet (frequently abbreviated as "Ce:YAG" or "YAG:Ce");

or $Th_{3-x}M_xO_{12}$:Ce (TAG) with M being selected from the group consisting of Y, Gd, La and Lu; or $Sr_{2-x-y}Ba_xCa_ySiO_4$:Eu.

Examples of green phosphors may be selected from the group of $SrGa_2S_4$:Eu; $Sr_{2-y}Ba_ySiO_4$:Eu and/or $SrSi_2O_2N_2$:Eu.

Phosphors which may be employed as converter in the converting layer of the LED are, for example: $Ba_2SiO_4$:$Eu^{2+}$, $BaSi_2O_5$:$Pb^{2+}$, $Ba_xSr_{1-x}F_2$:$Eu^{2+}$, $BaSrMgSi_2O_7$:$Eu^{2+}$, $BaTiP_2O_7$, $(Ba,Ti)_2P_2O_7$:Ti, $Ba_3WO_6$:U, $BaY_2F_8$:$Er^{3+}$,$Yb^+$, $Be_2SiO_4$:$Mn^{2+}$, $Bi_4Ge_3O_{12}$, $CaAl_2O_4$:$Ce^{3+}$, $CaLa_4O_7$:$Ce^{3+}$, $CaAl_2O_4$:$Eu^{2+}$, $CaAl_2O_4$:$Mn^{2+}$, $CaAl_4O_7$:$Pb^{2+}$, $Mn^{2+}$, $CaAl_2O_4$:$Tb^{3+}$, $Ca_3Al_2Si_3O_{12}$:$Ce^{3+}$, $Ca_3Al_2Si_3O_{12}$:$EU^{2+}$, $Ca_2B_5O_9Br$:$EU^{2+}$, $Ca_2B_5O_9Cl$:$EU^{2+}$, $Ca_2B_5O_9Cl$:$Pb^{2+}$, $CaB_2O_4$:$Mn^{2+}$, $Ca_2B_2O_5$:$Mn^{2+}$, $CaB_2O_4$:$Pb^{2+}$, $CaB_2P_2O_9$:$Eu^{2+}$, $Ca_5B_2SiO_{10}$:$Eu^{3+}$, $Ca_{0.5}Ba_{0.5}Al_{12}O_{19}$:$Ce^{3+}$,$Mn^{2+}$, $Ca_2Ba_3(PO_4)_3C$:$Eu^{2+}$, $CaBr_2$:$Eu^{2+}$ in $SiO_2$, $CaCl_2$):$Eu^{2+}$ in $SiO_2$, $CaCl_2$:$Eu^{2+}$,$Mn^{2+}$ in $SiO_2$, $CaF_2$:$Ce^{3+}$, $CaF_2$:$Ce^{3+}$,$Mn^{2+}$, $CaF_2$:$Ce^{3+}$,$Tb^{3+}$, $CaF_2$:$Eu^{2+}$, $CaF_2$:$Mn^{2+}$, $CaF_2$:U, $CaGa_2O_4$:$Mn^{2+}$, $CaGa_4O_7$:$Mn^{2+}$, $CaGa_2S_4$:$Ce^{3+}$, $CaGa_2S_4$:$Eu^{2+}$, $CaGa_2S_4$:$Mn^{2+}$, $CaGa_2S_4$:$Pb^{2+}$, $CaGeO_3$:$Mn^{2+}$, $Ca_{12}$:$Eu^{2+}$ in $SiO_2$, $Ca_{12}$:$Eu^{2+}$,$Mn^{2+}$ in $SiO_2$, $CaLaBO_4$:$Eu^{3+}$, $CaLaB_3O_7$:$Ce^{3+}$,$Mn^{2+}$, $Ca_2La_2BO_{6.5}$:$Pb^{2+}$, $Ca_2MgSi_2O_7$, $Ca_2MgSi_2O_7$:$Ce^{3+}$, $CaMgSi_2O_6$:$Eu^{2+}$, $Ca_3MgSi_2O_8$:$Eu^{2+}$, $Ca_2MgSi_2O_7$:$Eu^{2+}$, $CaMgSi_2O_6$:$Eu^{2+}$,$Mn^{2+}$, $Ca_2MgSi_2O_7$:$Eu^{2+}$,$Mn^{2+}$, $CaMoO_4$, $CaMoO_4$:$Eu^{3+}$, $CaO$:$Bi^{3+}$, $CaO$:$Cd^{2+}$, $CaO$:$Cu^+$, $CaO$:$Eu^{3+}$, $CaO$:$Eu^{3+}$, $Na^+$, $CaO$:$Mn^{2+}$, $CaO$:$Pb^{2+}$, $CaO$:$Sb^{3+}$, $CaO$:$Sm^{3+}$, $CaO$:$Tb^{3+}$, $CaO$:Tl, $CaO$:$Zn^{2+}$, $Ca_2P_2O_7$:$Ce^{3+}$, $\alpha$-$Ca_3(PO_4)_2$:$Ce^{3+}$, $\beta$-$Ca_3(PO_4)_2$:$Ce^{3+}$, $Ca_5(PO_4)_3C_1$:$EU^{2+}$, $Ca_5(PO_4)_3C_1$:$Mn^{2+}$, $Ca_5(PO_4)_3C_1$:$Sb^{3+}$, $Ca_5(PO_4)_3C_1$:$Sn^{2+}$, $\beta$-$Ca_3(PO_4)_2$:$Eu^{2+}$,$Mn^{2+}$, $Ca_5(PO_4)_3F$:$Mn^{2+}$, $Ca_5(PO_4)_3F$:$Sb^{3+}$, $Ca_5(PO_4)_3F$:$Sn^{2+}$, $\alpha$-$Ca_3(PO_4)_2$:$EU^{2+}$, $\beta$-$Ca_3(PO_4)_2$:$EU^{2+}$, $Ca_2P_2O_7$:$EU^{2+}$, $Ca_2P_2O_7$:$Eu^{2+}$,$Mn^{2+}$, $CaP_2O_6$:$Mn^{2+}$, $\alpha$-$Ca_3(PO_4)_2$:$Pb^{2+}$, $\alpha$-$Ca_3(PO_4)_2$:$Sn^{2+}$, $\beta$-$Ca_3(PO_4)_2$:$Sn^{2+}$, $\beta$-$Ca_2P_2O_7$:Sn,Mn, $\alpha$-$Ca_3(PO_4)_2$:Tr, CaS:$Bi^{3+}$, CaS:$Bi^{3+}$,Na, CaS:$Ce^{3+}$, CaS:$Eu^{2+}$, CaS:$Cu^+$, $Na^+$, CaS:$La^{3+}$, CaS:$Mn^{2+}$, $CaSO_4$:Bi, $CaSO_4$:$Ce^{3+}$, $CaSO_4$:$Ce^3$,$Mn^{2+}$, $CaSO_4$:$Eu^{2+}$, $CaSO_4$:$Eu^2$,$Mn^{2+}$, $CaSO_4$:$Pb^{2+}$, CaS:$Pb^{2+}$, CaS:$Pb^{2+}$,Cl, CaS:$Pb^{2+}$,$Mn^{2+}$, CaS:$Pr^{3+}$,$Pb^{2+}$,Cl, CaS:$Sb^{3+}$, CaS:$Sb^{3+}$,Na, CaS:$Sm^{3+}$, CaS:$Sn^{2+}$, CaS:$Sn^{2+}$,F, CaS:$Tb^{3+}$, CaS:$Tb^{3+}$,Cl, CaS:$Y^{3+}$, CaS:$Yb^{2+}$, CaS:$Yb^{2+}$,Cl, $CaSiO_3$:$Ce^{3+}$, $Ca_3SiO_4Cl_2$:$Eu^{2+}$, $Ca_3SiO_4Cl_2$:$Pb^{2+}$, $CaSiO_3$:$Eu^{2+}$, $CaSiO_3$:$Mn^{2+}$,Pb, $CaSiO_3$:$Pb^{2+}$, $CaSiO_3$:$Pb^{2+}$,$Mn^{2+}$, $CaSiO_3$:$Ti^{4+}$, $CaSr_2(PO_4)_2$:$Bi^{3+}$, $\beta$-$(Ca,Sr)_3(PO_4)_2$:$Sn^{2+}$$Mn^{2+}$, $CaTi_{0.9}Al_{0.1}O_3$:$Bi^{3+}$, $CaTiO_3$:$Eu^{3+}$, $CaTiO_3$:$Pr^{3+}$, $Ca_5(VO_4)_3Cl$, $CaWO_4$, $CaWO_4$:$Pb^{2+}$, $CaWO_4$:W, $Ca_3WO_6$:U, $CaYAlO_4$:$EU^{3+}$, $CaYBO_4$:$Bi^{3+}$, $CaYBO_4$:$EU^{3+}$, $CaYB_{0.8}O_{3.7}$:$EU^{3+}$, $CaY_2ZrO_6$:$EU^{3+}$, $(Ca,Zn,Mg)_3(PO_4)_2$:Sn, $CeF_3$, $(Ce,Mg)BaAl_{11}O_{18}$:Ce, $(Ce,Mg)SrAl_{11}O_{18}$:Ce, $CeMgAl_{11}O_{19}$:Ce:Tb, $Cd_2B_6O_{11}$:$Mn^{2+}$, CdS:$Ag^+$,Cr, CdS:In, CdS:In,Te, CdS:Te, $CdWO_4$, CsF, CsI, CSI:$Na^+$, CsI:Tl, $(ErCl_3)_{0.25}(BaCl_2)_{0.75}$, GaN:Zn, $Gd_3Ga_5O_{12}$:$Cr^{3+}$, $Gd_3Ga_5O_{12}$:Cr,Ce, $GdNbO_4$:$Bi^{3+}$, $Gd_2O_2S$:$Eu^{3+}$, $Gd_2O_2SPr^{3+}$, $Gd_2O_2S$:Pr,Ce,F, $Gd_2O_2S$:$Tb^{3+}$, $Gd_2SiO_5$:$Ce^{3+}$, $KAl_{11}O_{17}$:$Tl^+$, $KGa_{11}O_{17}$:$Mn^{2+}$, $K_2La_2Ti_3O_{10}$:Eu, $KMgF_3$:$Eu^{2+}$, $KMgF_3$:$Mn^{2+}$, $K_2SiF_6$:$Mn^{4+}$, $LaAl_3B_4O_{12}$:$EU^{3+}$, $LaAlB_2O_6$:$Eu^{3+}$, $LaAlO_3$:$Eu^{3+}$, $LaAlO_3$:$Sm^{3+}$, $LaASO_4$:$EU^{3+}$, $LaBr_3$:$Ce^{3+}$, $LaBO_3$:$EU^{3+}$, $(La,Ce,Tb)PO_4$:Ce:Tb, $LaCl_3$:$Ce^{3+}$, $La_2O_3$:$Bi^{3+}$, $LaOBr$:$Tb^{3+}$, $LaOBr$:$Tm^{3+}$, $LaOCl$:$Bi^{3+}$, $LaOCl$:$Eu^{3+}$, $LaOF$:$Eu^{3+}$, $La_2O_3$:$Eu^{3+}$, $La_2O_3$:$Pr^{3+}$, $La_2O_2S$:$Tb^{3+}$, $LaPO_4$:$Ce^{3+}$, $LaPO_4$:$Eu^{3+}$, $LaSiO_3Cl$:$Ce^{3+}$, $LaSiO_3Cl$:$Ce^{3+}$,$Tb^{3+}$, $LaVO_4$:$Eu^{3+}$, $La_2W_3O_{12}$:$Eu^{3+}$, $LiAlF_4$:$Mn^{2+}$, $LiAl_5O_8$:$Fe^{3+}$, $LiAlO_2$:$Fe^{3+}$, $LiAlO_2$:$Mn^{2+}$, $LiAl_5O_8$:$Mn^{2+}$, $Li_2CaP_2O_7$:$Ce^{3+}$,$Mn^{2+}$, $LiCeBa_4Si_4O_{14}$:$Mn^{2+}$, $LiCeSrBa_3Si_4O_{14}$:$Mn^{2+}$, $LiInO_2$:$Eu^{3+}$, $LiInO_2$:$Sm^{3+}$, $LiLaO_2$:$Eu^{3+}$, $LuAlO_3$:$Ce^{3+}$, $(Lu,Gd)_2SiO_5$:$Ce^{3+}$, $Lu_2SiO_5$:$Ce^{3+}$, $Lu_2Si_2O_7$:$Ce^{3+}$, $LuTaO_4$:$Nb^{5+}$, $Lu_{1-x}Y_xAlO_3$:$Ce^{3+}$, $MgAl_2O_4$:$Mn^{2+}$, $MgSrAl_{10}O_{17}$:Ce, $MgB_2O_4$:$Mn^{2+}$, $MgBa_2(PO_4)_2$:$Sn^{2+}$, $MgBa_2(PO_4)_2$:U, $MgBaP_2O_7$:$Eu^{2+}$, $MgBaP_2O_7$:$Eu^{2+}$,$Mn^{2+}$, $MgBa_3Si_2O_8$:$Eu^{2+}$, $MgBa(SO_4)_2$:$Eu^{2+}$, $Mg_3Ca_3(PO_4)_4$:$Eu^{2+}$, $MgCaP_2O_7$:$Mn^{2+}$, $Mg_2Ca(SO_4)_3$:$Eu^{2+}$, $Mg_2Ca(SO_4)_3$:$Eu^{2+}$,$Mn^2$, $MgCeAl_{11}O_{19}$:$Tb^{3+}$, $Mg_4(F)GeO_6$:$Mn^{2+}$, $Mg_4(F)(Ge,Sn)O_6$:$Mn^{2+}$, $MgF_2$:$Mn^{2+}$, $MgGa_2O_4$:$Mn^{2+}$, $Mg_8Ge_2O_{11}F_2$:$Mn^{4+}$, MgS:$Eu^{2+}$, $MgSiO_3$:$Mn^{2+}$, $Mg_2SiO_4$:$Mn^{2+}$, $Mg_3SiO_3F_4$:$Ti^{4+}$, $MgSO_4$:$Eu^{2+}$, $MgSO_4$:$Pb^{2+}$, $(Mg,Sr)Ba_2Si_2O_7$:$Eu^{2+}$, $MgSrP_2O_7$:$Eu^{2+}$, $MgSr_5(PO_4)_4$:$Sn^{2+}$, $MgSr_3Si_2O_8$:$Eu^{2+}$,$Mn^{2+}$, $Mg_2Sr(SO_4)_3$:$Eu^{2+}$, $Mg_2TiO_4$:$Mn^{4+}$, $MgWO_4$, $MgYBO_4$:$Eu^{3+}$, $Na_3Ce(PO_4)_2$:$Tb^{3+}$, NaI:Tl, $Na_{1.23}K_{0.42}Eu_{0.12}TiSi_4O_{11}$:$Eu^{3+}$, $Na_{1.23}K_{0.42}Eu_{0.12}TiSi_5O_{13}.xH_2O$:$EU^{3+}$, $Na_{1.29}K_{0.46}Er_{0.08}TiSi_4O_{11}$:$EU^{3+}$, $Na_2Mg_3Al_2Si_2O_{10}$:Tb, $Na(Mg_{2-x}Mn_x)LiSi_4O_{10}F_2$:Mn, $NaYF_4$:$Er^{3+}$, $Yb^{3+}$, $NaYO_2$:$Eu^{3+}$, P46(70%)+P47 (30%), $SrAl_{12}O_{19}$:$Ce^{3+}$, $Mn^{2+}$, $SrAl_2O_4$:$Eu^{2+}$, $SrAl_4O_7$:$Eu^{3+}$, $SrAl_{12}O_{19}$:$Eu^{2+}$, $SrAl_2S_4$:$Eu^{2+}$, $Sr_2B_5O_9Cl$:$Eu^{2+}$, $SrB_4O_7$:$Eu^{2+}$(F,Cl,Br), $SrB_4O_7$:$Pb^{2+}$, $SrB_4O_7$:$Pb^{2+}$, $Mn^{2+}$, $SrB_8O_{13}$:$Sm^{2+}$, $Sr_xBa_yCl_zAl_2O_{4-z/2}$:$Mn^{2+}$, $Ce^{3+}$, $SrBaSiO_4$:$Eu^{2+}$, $Sr(Cl,Br,I)_2$:$Eu^{2+}$ in $SiO_2$, $SrCl_2$:$Eu^{2+}$ in $SiO_2$, $Sr_5Cl(PO_4)_3$:Eu, $Sr_wF_xB_4O_{6.5}$:$Eu^{2+}$, $Sr_wF_xB_yO_z$:$Eu^{2+}$,$Sm^{2+}$, $SrF_2$:$Eu^{2+}$, $SrGa_{12}O_{19}$:$Mn^{2+}$, $SrGa_2S_4$:$Ce^{3+}$, $SrGa_2S_4$:$Eu^{2+}$, $SrGa_2S_4$:$Pb^{2+}$, $SrIn_2O_4$:$Pr^{3+}$, $Al^{3+}$, $(Sr,Mg)_3(PO_4)_2$:Sn, $SrMgSi_2O_6$:$Eu^{2+}$, $Sr_2MgSi_2O_7$:$Eu^{2+}$, $Sr_3MgSi_2O_8$:$Eu^{2+}$, $SrMoO_4$:U, $SrO.3B_2O_3$:$Eu^{2+}$,Cl, $\beta$-$SrO.3B_2O_3$:$Pb^{2+}$, $\beta$-$SrO.3B_2O_3$:$Pb^{2+}$,$Mn^{2+}$, $\alpha$-$SrO.3B_2O_3$:$Sm^{2+}$, $Sr_6P_5BO_{20}$:Eu, $Sr_5(PO_4)_3C_1$:$EU^{2+}$, $Sr_5(PO_4)_3C_1$:$EU^{2+}$,$Pr^{3+}$, $Sr_5(PO_4)_3C_1$:$Mn^{2+}$, $Sr_5(PO_4)_3C_1$:$Sb^{3+}$, $Sr_2P_2O_7$:$Eu^{2+}$, $\beta$-$Sr_3(PO_4)_2$:$Eu^{2+}$, $Sr_5(PO_4)_3F$:$Mn^{2+}$, $Sr_5(PO_4)_3F$:$Sb^{3+}$, $Sr_5(PO_4)_3F$:$Sb^{3+}$,$Mn^{2+}$, $Sr_5(PO_4)_3F$:$Sn^{2+}$, $Sr_2P_2O_7$:$Sn^{2+}$, $\beta$-$Sr_3(PO_4)_2$:$Sn^{2+}$, $\beta$-$Sr_3(PO_4)_2$:$Sn^{2+}$,$Mn^{2+}$ (Al), SrS:$Ce^{3+}$, SrS:$Eu^{2+}$, SrS:$Mn^{2+}$, SrS:$Cu^+$,Na, $SrSO_4$:Bi, $SrSO_4$:$Ce^{3+}$, $SrSO_4$:$Eu^{2+}$, $SrSO_4$:$Eu^{2+}$,$Mn^{2+}$, $Sr_5Si_4O_{10}Cl_6$:$Eu^{2+}$, $Sr_2SiO_4$:$Eu^{2+}$, $SrTiO_3$:$Pr^{3+}$, $SrTiO_3$:$Pr^{3+}$,$Al^{3+}$, $Sr_3WO_6$:U, $SrY_2O_3$:$Eu^{3+}$, $ThO_2$:$Eu^{3+}$, $ThO_2$:$Pr^{3+}$, $ThO_2$:$Tb^{3+}$, $YAl_3B_4O_{12}$:$Bi^{3+}$, $YAl_3B_4O_{12}$:$Ce^{3+}$, $YAl_3B_4O_{12}$:$Ce^{3+}$, Mn, $YAl_3B_4O_{12}$:$Ce^{3+}$,$Tb^{3+}$, $YAl_3B_4O_{12}$:$Eu^{3+}$, $YAl_3B_4O_{12}$:$Eu^{3+}$,$Cr^{3+}$, $YAl_3B_4O_{12}$:$Th^{4+}$,$Ce^{3+}$,$Mn^{2+}$, $YAlO_3$:$Ce^{3+}$, $Y_3Al_5O_{12}$:$Ce^{3+}$, $Y_3Al_5O_{12}$:$Cr^{3+}$, $YAlO_3$:$Eu^{3+}$, $Y_3Al_5O_{12}$:$Eu^{3+}$, $Y_4Al_2O_9$:$Eu^{3+}$, $Y_3Al_5O_{12}$:$Mn^{4+}$, $YAlO_3$:$Sm^{3+}$, $YAlO_3$:$Tb^{3+}$, $Y_3Al_5O_{12}$:$Tb^{3+}$, $YAsO_4$:$Eu^{3+}$, $YBO_3$:$Ce^{3+}$, $YBO_3$:$Eu^{3+}$, $YF_3$:$Er^{3+}$,$Yb^{3+}$, $YF_3$:$Mn^{2+}$, $YF_3$:$Mn^{2+}$,$Th^{4+}$, $YF_3$:$Tm^{3+}$,$Yb^{3+}$, $(Y,Gd)BO_3$:Eu, $(Y,Gd)BO_3$:Tb, $(Y,Gd)_2O_3$:$Eu^{3+}$, $Y_{1.34}Gd_{0.60}O_3$(Eu,Pr), $Y_2O_3$:$Bi^{3+}$, YOBr:$Eu^{3+}$, $Y_2O_3$:Ce, $Y_2O_3$:$Er^{3+}$, $Y_2O_3$:$Eu^{3+}$(YOE), $Y_2O_3$:$Ce^{3+}$,$Tb^{3+}$, YOCl:$Ce^{3+}$, YOCl:$Eu^{3+}$, YOF:$Eu^{3+}$, YOF:$Tb^{3+}$, $Y_2O_3$:$Ho^{3+}$, $Y_2O_2S$:$Eu^{3+}$, $Y_2O_2S$:$Pr^{3+}$, $Y_2O_2S$:$Tb^{3+}$, $Y_2O_3$:$Tb^{3+}$, $YPO_4$:$Ce^{3+}$, $YPO_4$:$Ce^{3+}$,$Tb^{3+}$, $YPO_4$:$Eu^{3+}$, $YPO_4$:$Mn^{2+}$,$Th^{4+}$, $YPO_4$:$V^{5+}$, $Y(P,V)O_4$:Eu, $Y_2SiO_5$:$Ce^{3+}$, $YTaO_4$, $YTaO_4$:$Nb^{5+}$, $YVO_4$:$Dy^{3+}$, $YVO_4$:$Eu^{3+}$, $ZnAl_2O_4$:$Mn^{2+}$, $ZnB_2O_4$:$Mn^{2+}$, $ZnBa_2S_3$:$Mn^{2+}$, $(Zn,Be)_2SiO_4$:$Mn^{2+}$, $Zn_{0.4}Cd_{0.6}S$:Ag, $Zn_{0.6}Cd_{0.4}S$:Ag, (Zn,Cd)S:Ag,Cl, (Zn,Cd)S:Cu, $ZnF_2$:$Mn^{2+}$, $ZnGa_2O_4$, $ZnGa_2O_4$:$Mn^{2+}$, $ZnGa_2S_4$:$Mn^{2+}$, $Zn_2GeO_4$:$Mn^2$, $(Zn,Mg)F_2$:$Mn^{2+}$, $ZnMg_2(PO_4)_2$:$Mn^{2+}$, $(Zn,Mg)_3(PO_4)_2$:$Mn^{2+}$, $ZnO$:$Al^{3+}$,$Ga^{3+}$, $ZnO$:$Bi^{3+}$, $ZnO$:$Ga^{3+}$, ZnO:Ga, ZnO—CdO:Ga, ZnO:S, ZnO:Se, ZnO:Zn, ZnS:$Ag^+$,$Cl^-$, ZnS:Ag,Cu,Cl, ZnS:Ag,Ni, ZnS:Au,In, ZnS—CdS (25-75), ZnS—CdS (50-50), ZnS—CdS (75-25), ZnS—CdS:Ag,Br,Ni, ZnS—CdS:$Ag^+$,Cl, ZnS—CdS:Cu,Br, ZnS—CdS:Cu,I, ZnS:$Cl^-$, ZnS:$Eu^{2+}$, ZnS:Cu, ZnS:$Cu^+$,$Al^{3+}$, ZnS:$Cu^+$,$Cl^-$, ZnS:Cu,Sn, ZnS:$Mn^{2+}$, ZnS:Mn,Cu, ZnS:$Mn^{2+}$,$Te^{2+}$, ZnS:P, ZnS:$P^{3-}$,$Cl^-$, ZnS:$Pb^{2+}$, ZnS:$Pb^{2+}$,$Cl^-$, ZnS:Pb,Cu, $Zn_3(PO_4)_2$:$Mn^{2+}$, $Zn_2SiO_4$:$Mn^{2+}$, $Zn_2SiO_4$:$Mn^{2+}$,$As^{5+}$, $Zn_2SiO_4$:Mn,$Sb_2O_2$, $Zn_2SiO_4$:

$Mn^{2+},P$, $Zn_2SiO_4:Ti^{4+}$, $ZnS:Sn^{2+}$, $ZnS:Sn,Ag$, $ZnS:Sn^{2+}$, $Li^+$, $ZnS:Te,Mn$, $ZnS-ZnTe:Mn^{2+}$, $ZnSe:Cu^+,Cl$ and/or $ZnWO_4$.

Finally, the present invention provides a method for producing an LED comprising the following steps:
(a) applying a formulation according to the invention to an LED precursor; and
(b) curing the formulation at a temperature of 70 to 300° C. for a period of 1 to 24 h.

Preferably, the LED precursor contains a semiconductor light source (LED chip) and/or lead frame and/or gold wire and/or solder (flip chip). The LED precursor may further optionally contain a converter and/or a primary optic and/or a secondary optic.

The converter layer may be arranged either directly on a semiconductor light source (LED chip) or alternatively remote therefrom, depending on the respective type of application. The encapsulation material forms a barrier against the external environment of the LED device, thereby protecting the converter and/or the LED chip. The encapsulating material is preferably in direct contact with the converter and/or the LED chip. The encapsulation material can be part of an LED device comprising an LED chip and/or lead frame and/or gold wire, and/or solder (flip chip), the filling material, converter and a primary and secondary optic.

It is preferred that the formulation which is applied in step (a) to an LED precursor forms part of a converter layer. It may be further preferred that the converter layer is in direct contact to an LED chip or is arranged remote therefrom.

Preferably, the converter layer further comprises a converter such as a phosphor and/or quantum material as defined above.

It is further preferred that the formulation is applied in step (a) as a layer in a thickness of 1 µm to 1 cm, more preferably of 10 µm to 1 mm to the LED. In a preferred embodiment, the formulation is applied as a thin layer having a thickness of 1 µm to 200 µm, more preferably of 5 µm to 150 µm and most preferably of 10 µm to 100 µm. In an alternative preferred embodiment, the formulation is applied as a thick layer having a thickness of 200 µm to 1 cm, more preferably of 200 µm to 5 mm and most preferably of 200 µm to 1 mm.

The formulation of the invention may be applied by any suitable application method such as, for example, dispensing, screen printing, stencil printing, spray coating, slot coating and other methods. Alternatively, the formulation may be applied by any other suitable method, such as spin coating or ink-jet printing.

In case of spray coating a rather high dilution is needed, typically a spray coating formulation contains a total solvent content of 70-95 weight %. Since the solvent content in spray coating formulations is very high, spray coating formulations are very sensitive to the type of solvents. It is general knowledge that spray coating formulations are made of mixtures of high and low boiling solvents (e.g. Organic Coatings: Science and Technology, Z. W. Wicks et al., page 482, 3$^{rd}$ Edition (2007), John Wiley & Sons, Inc.).

For example, it is preferred that the total content of the polymer and the surface-modified zirconium dioxide nanocrystal is in the range from 5 to 30 weight %, more preferably from 5 to 25 weight % and most preferably from 5 to 20 weight %, if spray coating is used. A typical solution for spray coating contains 2 to 5 weight % polymer, 4 to 12 weight % surface-modified zirconium dioxide nanocrystal, 6 to 20 weight % converter, 70 to 90 weight % solvent and <1 weight % other additives, with the respective weight percentages of the components of the spray coating formulation adding up to 100 weight %. The solvent is either a pure solvent or a mixture of several solvents as described above.

Suitable formulations preferably have a viscosity of at least 1 mPa·s and of at most 100,000 mPa·s, determined as described in the test methods. During the application of the formulation the viscosity of the formulation may optionally be modified by changing the temperature at which the composition is deposited, for example, between 10° C. and 60° C. A low viscosity is usually in the range from 1 to 100 mPa·s, whereas a high viscosity is usually more than 100 mPa·s.

A preferred solvent system for spray coating application is made up of two groups of solvent(s) A) and B). A) is one solvent or a mixture of two or more solvents characterized by a boiling point of <90° C. Preferred solvents of group A) are esters like methyl acetate or ethyl acetate, ethers like THF or ketones like methyl-ethyl ketone. B) is one solvent or a mixture of two or more solvents characterized by a boiling point of >90° C. Preferred solvents of group B) are esters like butyl acetate, ethers like di-butyl ether, alkanes like heptane, octane, nonane or decane, and aromatic solvents like benzene, toluene or xylene.

After having been applied to an LED precursor in step (a), the formulation is cured in step (b) at a temperature of 70 to 300° C. for a period of 1 h to 24 h.

Preferably, the curing in step (b) is carried out on a hot plate, in a furnace, or in a climate chamber.

Preferably, the curing in step (b) is carried out on a hot plate at a temperature of 100 to 280° C., more preferably from 120 to 270° C., and most preferably from 150 to 250° C.

In an alternative preferred embodiment, the curing in step (b) is carried out in a furnace at a temperature of 100 to 280° C., more preferably from 120 to 270° C., and most preferably from 150 to 250° C.

In an alternative preferred embodiment, the curing in step (b) is carried out in a climate chamber having a relative humidity in the range from 50 to 99%, more preferably from 60 to 95%, and most preferably from 80 to 90%, at a temperature from 70 to 95° C., more preferably from 80 to 90° C.

Preferably, the curing time is from 2 to 20 h, more preferably from 3 to 18 h, and most preferably from 4 to 16 h, depending on the application thickness, the monomer composition of the polymer and the curing method.

The LED according to the present invention may, for example, be used for backlights for liquid crystal (LC) displays, traffic lights, outdoor displays, billboards, general lighting, to name only a few non-limiting examples.

A typical LED package according to the invention comprises an LED chip, and/or a lead frame and/or gold wire and/or solder (flip chip) and/or the filling material, converter, the present encapsulation material and a primary and secondary optic. The encapsulation material has the function of a surface protection material against external environmental influences and guarantees long term reliability in particular aging stability. For example, in accordance with the present invention a light emitting diode is constructed similarly to the ones described in U.S. Pat. No. 6,274,924 B1 and U.S. Pat. No. 6,204,523 B1.

Moreover, a LED filament as described in US 2014/0369036 A1 may be prepared using the present encapsulation material as a package adhesive layer. Such LED filaments include a substrate, a light emitting unit secured onto at least one side surface of the substrate, and a package adhesive layer surrounded on the periphery of the light emitting unit. The substrate is configured to be of an elongated bar construction. The emitting unit includes a plurality of blue light chips and red light chips regularly distributed on the substrate and sequentially connected to one another in series. The package adhesive layer is made from the encapsulation material according to the present invention containing a converter.

The present invention is further illustrated by the examples following hereinafter which shall in no way be construed as limiting. The skilled person will acknowledge that various modifications, additions and alternations may be made to the invention without departing from the spirit and scope of the invention as defined in the appended claims.

Test Methods

Molecular weights of the polymers were determined by GPC against a polystyrene standard. As eluent a mixture of tetrahydrofuran and 1.45 weight % (relative to the total weight of the eluent) hexamethyldisilazane was used. Columns were Shodex KS-804 and 2×KS-802 and KS-801. The detector was an Agilent 1260 refractive index detector.

Viscosity was determined using a Brookfield Rheometer R/S plus with a Brookfield cone-type spindle RC3-50-1 at a rotation speed of 3 rpm and a temperature of 25° C.

EXAMPLES

The following siloxazane polymers consisting of up to four monomer units as shown in Table 1 were used in the examples:

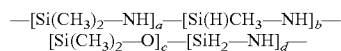

TABLE 1

Composition of Polymers 1 to 7.

| Polymer | mol % a | mol % b | mol % c | mol % d | molecular weight [g/mol] |
|---|---|---|---|---|---|
| Polymer 1[1] | 50 | 50 | 0 | 0 | 5,500 |
| Polymer 2[1] | 25 | 25 | 50 | 0 | 7,700 |
| Polymer 3[2] | 40 | 40 | 20 | 0 | 6,600 |
| Polymer 4[1] | 40 | 40 | 20 | 0 | 7,300 |
| Polymer 5[1] | 40 | 20 | 40 | 0 | 8,700 |
| Polymer 6[2] | 20 | 40 | 40 | 0 | 10,100 |
| Polymer 7[1] | 30 | 20 | 30 | 20 | 8,300 |

[1]Random copolymer
[2]Block copolymer
Polymer 1 is available from MERCK Performance Materials Germany GmbH under the trade name Durazane 1050.

Preparation of Polymers 2, 4, 5 and 7 (Random Copolymers)

All starting materials were obtained from commercial sources, for example dichlorosilane from Gelest Inc. USA, dichloromethylsilane and dichloro-dimethylsilane from Sigma-Aldrich, and the α,ω-dichloro-dimethylsilicones from ABCR.

General Procedure: A 4 l vessel was charged with 1500 g of liquid ammonia at 0° C. and a pressure of between 3 bar and 5 bar. 850 g of a mixture of the dichlorosilane monomers as shown in Table 2 were slowly added over a period of 3 h. After stirring the resulting reaction mixture for an additional 3 h the stirrer was stopped and the lower phase isolated and evaporated to remove dissolved ammonia. After filtration a colourless viscous oil remained.

TABLE 2

Monomers used for preparation of Polymers 2, 4, 5 and 7.

| Polymer | Monomers |
|---|---|
| Polymer 2 | 250 g $Cl_2Si(H)CH_3$, 600 g $Cl-[Si(CH_3)_2-O]_2-Si(CH_3)_2-Cl$ |
| Polymer 4 | 347 g $Cl_2Si(H)CH_3$, 194 g $Cl_2Si(CH_3)_2$, 307 g $Cl-Si(CH_3)_2-O-Si(CH_3)_2-Cl$ |
| Polymer 5 | 88 g $Cl_2Si(H)CH_3$, 662 g $Cl-Si(CH_3)_2-O-Si(CH_3)_2-Cl$ |
| Polymer 7 | 163 g $Cl_2SiH_2$, 185 g $Cl_2Si(H)CH_3$, 498 g $Cl-Si(CH_3)_2-O-Si(CH_3)_2-Cl$ |

Preparation of Polymers 3 and 6 (Block Copolymers)

Starting materials were obtained from commercial sources, for example dichloromethylsilane and dichloro-dimethylsilane from Sigma-Aldrich, and the α,ω-bishydroxy-dimethylsilicones from ABCR.

General procedure: A 2 l flask was charged under nitrogen atmosphere with 1000 g n-heptane and a mixture of the dichlorosilane monomers and the silanol-terminated polydimethylsiloxane as shown in Table 3. At a temperature of 0° C., ammonia was slowly bubbled through the solution for 6 h. Precipitation of ammonium chloride was observed. The solid ammonium chloride was removed by filtration, yielding a clear filtrate, from which the solvent was removed by evaporation under reduced pressure. A colourless low viscous liquid was obtained.

TABLE 3

Monomers used for preparation of Polymers 3 and 6.

| Polymer | Monomers |
|---|---|
| Polymer 3 | 20.6 g $Cl_2Si(H)CH_3$, 24.9 g $Cl_2Si(CH_3)_2$, 5.8 g $HO-[Si(CH_3)_2-O]_5-H$ |
| Polymer 6 | 26.2 g $Cl_2Si(H)CH_3$, 15.4 g $Cl_2Si(CH_3)_2$, 16.8 g $HO-[Si(CH_3)_2-O]_{45}-H$ |

The molecular weight was analyzed using the following GPC conditions: the eluent was a mixture of THF and 1.45 weight % hexamethyldisilazane, the columns were Shodex KS-804 and 2×KS-802 and KS-801 and the detector was an Agilent 1260 Refractive Index Detector. The calibration was done with polystyrene standards.

50-70 weight % surface-modified silicone capped $ZrO_2$ nanocrystal dispersions, PCSM23 in butyl acetate or xylene were used which are available from Pixelligent Technologies, USA.

The refractive index of the encapsulation materials was measured by spin coating the formulation containing the polymer in xylene and the surface modified silicone capped $ZrO_2$ nanocrystals in xylene on a 3 inch Si wafer at a film thickness of 1 μm and curing the film on a hotplate at 150° C. for 4 h. The measurement tool was a Prism Coupler Model 2010/M of the company Metricon working at 594 nm at 25° C. Tables 4 and 5 show the respective weight ratios of the polymers and surface-modified $ZrO_2$ nanocrystals.

TABLE 4

Weight ratio of Polymer 1 and surface-modified $ZrO_2$ nanocrystal.

| Weight Ratio Polymer 1 : surface-modified $ZrO_2$ | Refractive Index at 594 nm and 25° C. |
|---|---|
| 100:0 | 1.50 |
| 50:50 | 1.58 |

TABLE 4-continued

Weight ratio of Polymer 1 and surface-modified ZrO₂ nanocrystal.

| Weight Ratio Polymer 1 : surface-modified ZrO₂ | Refractive Index at 594 nm and 25° C. |
|---|---|
| 30:70 | 1.64 |
| 20:80 | 1.69 |

TABLE 5

Weight ratio of Polymer 3 and surface-modified ZrO₂ nanocrystal.

| Weight Ratio Polymer 3:surface-modified ZrO₂ | Refractive Index at 594 nm at 25° C. |
|---|---|
| 100:0 | 1.47 |
| 50:50 | 1.55 |
| 30:70 | 1.61 |
| 20:80 | 1.65 |

Figure 5:
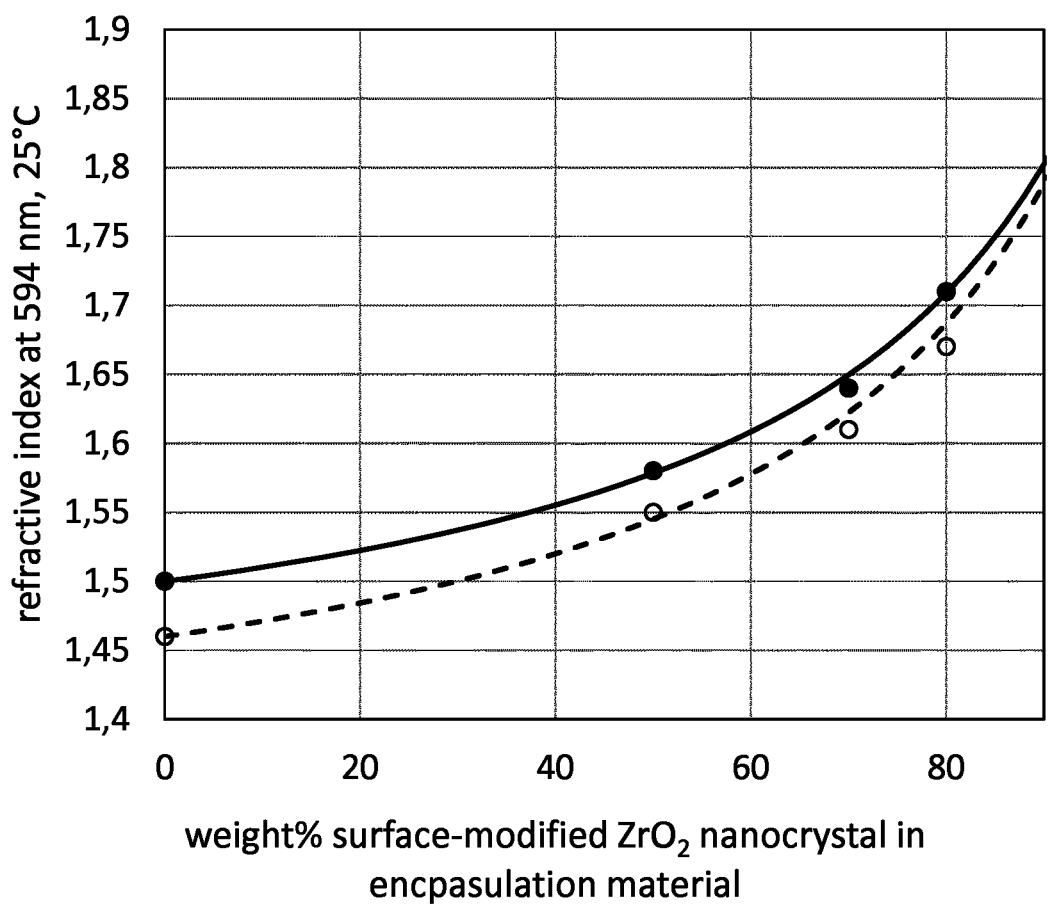
FIG. 5 shows measured refractive index values in comparison to respective calculated curves:
• Polymer 1+surface-modified $ZrO_2$ nanocrystal, measured values
 Polymer 1+surface-modified $ZrO_2$ nanocrystal, calculated curve
○ Polymer 3+surface-modified $ZrO_2$ nanocrystal, measured values

These examples show the effect of the $ZrO_2$ nanocrystal addition on the refractive index of the hybrid material. It is possible to reach refractive indices of up to 1.7. The measured refractive index is very close to the theoretically calculated numbers as shown in FIG. 5.

The refractive index of any material is to a certain extent always temperature dependent. For an LED application, a change in the refractive index of the encapsulant/binder changes the optical conditions. Thus, the colour and brightness of an LED device are temperature dependent. Therefore, encapsulants/binders having a low temperature dependence of the refractive index (which usually decreases with increasing temperature) are preferred. As shown in FIG. 6, the siloxazane based materials have a clearly lower refractive index decrease when heated in comparison to methyl- and phenylsilicones.

To show its usefulness for LED devices, the polymer in butyl acetate and the surface modified silicone capped $ZrO_2$ nanocrystals in butyl acetate were blended with phosphor light converter particles (Isiphor® YYG 545 200, available from MERCK KGaA) in weight ratios ranging from 1:2 to 1:4, and the blend then spray coated as a 40 μm to 80 μm thick layer onto an LED chip mounted onto an LED package (available from Excelitas). For curing the polymer the LED was then placed on a hotplate at 150° C. for 8 hours.

The amount of phosphor on the LED chip was adjusted to reach a colour point of x=0.350 and y=0.330 according to the CIE definition. The LEDs were operated at a current of 1.5 A at ambient conditions for 1000 h and the change in colour coordinates was measured. A generally tolerated deviation of colour coordinates after 1000 h is +/−1%. As reference materials methylsilicone (OE-6370, DowCorning, refractive index=1.41) and phenylsilicone (OE-6550 Dow-Corning, refractive index=1.54) were used. The measured colour point deviation is shown in subsequent Table 6.

TABLE 6

Deviation of colour point.

| Formulation (weight ratio) | Δx/Δy after 1,000 h[1] |
|---|---|
| phenylsilicone:phosphor = 1:3 | +0.008/+0.010 |
| methylsilicone:phosphor = 1:3 | +0.003/+0.002 |
| Polymer 4:phosphor = 1:3 | +0.002/+0.003 |
| Polymer 6:phosphor = 1:3 | +0.003/+0.003 |

TABLE 6-continued

Deviation of colour point.

| Formulation (weight ratio) | Δx/Δy after 1,000 h[1] |
|---|---|
| Polymer 4:ZrO₂:phosphor = 1:1:3.5 | +0.003/+0.002 |
| Polymer 5:ZrO₂:phosphor = 1:2:4 | +0.003/+0.003 |
| Polymer 6:ZrO₂:phosphor = 1:2:4 | +0.004/+0.004 |

[1]Measurement error = +/−0.001

These examples demonstrate the stability of the encapsulation material under LED conditions. Methylsilicone is known to have excellent stability, but a low refractive index of only 1.41. Phenylsilicones have refractive indices in the range of 1.54, however, their stability is much worse. As a consequence, a significant shift in colour coordinates is observed. The siloxazane-capped $ZrO_2$ encapsulation materials show a stability comparable to methylsilicone and are able to cover a bigger range of refractive index from 1.45 up to 1.70.

The curing properties of pure siloxazane formulations and siloxazane formulations with surface modified silicone capped $ZrO_2$ nanocrystals were compared by pouring the pure siloxazane formulations and the silioxazane-capped $ZrO_2$ formulations at different mixing ratios into plain glass bowls and evaporating all solvent under vacuum and exclusion of moisture to give a film thickness of the solvent free material of 0.5 mm. The glass bowls are then placed on a hot-plate at 150° C. under ambient conditions for 4 hours and the stickiness of the film was checked (Table 7).

TABLE 7

Curing and film properties.

| Material | Film after 4 h @ 150° C. |
|---|---|
| Polymer 6 (pure siloxazane) | sticky |
| Polymer 6:ZrO₂ = 1:1 (w/w) | slightly sticky |
| Polymer 6:ZrO₂ = 1:2 (w/w) | dry |

Hence, the addition of surface-modified $ZrO_2$ nanocrystals accelerates the curing of the siloxazane polymer leading to an efficient LED manufacturing process with a high throughput.

Furthermore, the barrier properties towards water vapor were analyzed by coating the formulation on a 0.2 μm pore size PTFE filter disc, curing the material for 4 h at 150° C. (methyl silicone) or for 16 h in a climate chamber at 85° C. and 85% relative humidity (pure siloxazane and siloxazane-capped $ZrO_2$ formulation). The measurement of the water vapor transmission rate (WVTR) was carried out with a MOCON Permatron-W 1/50 at a temperature of 38° C. and a relative humidity of 90%. The materials were coated on a 0.2 μm pore size PTFE filter disc as a carrier at a film thickness of 100-150 μm. The number of the methyl silicone was normalized to 100%

(Table 8).

TABLE 8

| Material | WVTR [%, methyl silicone set to 100%] |
|---|---|
| methyl silicone[1] | 100 |
| phenyl silicone[2] | 27 |
| pure siloxazane[3] | 16 |
| Polymer 3:ZrO$_2$ = 1:1 (w/w) | 11 |

[1] methyl silicone = Dow Corning OE 6370
[2] phenyl silicone = Dow Corning OE 6550
[3] polymer 6

As shown in Table 8 above, the siloxazane-ZrO$_2$ formulation provides a better protection against water vapor when compared with a pure siloxazane or methyl silicone formulation. Hence, the formulations according to the present invention allow a better protection of the light converter particles and prevents a possible degradation of the converter material by moisture, which usually results in a colour change as a consequence of reduced conversion efficiency of the degraded phosphor.

The invention claimed is:

1. A formulation comprising:
a polymer comprising a first repeating unit M$^1$ and a second repeating unit M$^2$; and
surface-modified zirconium dioxide nanocrystals;
wherein the first repeating unit M$^1$ is represented by formula (I) and the second repeating unit M$^2$ is represented by formula (II):

—[—SiR$^1$R$^2$—NR$^5$—]—     (I)

—[—SiR$^3$R$^4$[O—SiR$^3$R$^4$—]$_a$—NR$^5$—]—     (II)

wherein R$^1$, R$^2$, R$^3$, R$^4$ and R$^5$ are at each occurrence independently from each other selected from the group consisting of hydrogen, organyl and organoheteryl; and
a is an integer from 1 to 60.

2. The formulation according to claim 1,
wherein the polymer comprises at least one further repeating unit M$^1$ which is represented by formula (I), wherein the at least one further repeating unit M$^1$ is different from the first repeating unit M$^1$.

3. The formulation according to claim 1,
wherein R$^1$ and R$^2$ are at each occurrence independently from each other hydrogen or alkyl having 1 to 20 carbon atoms or phenyl.

4. The formulation according to claim 1,
wherein R$^3$ and R$^4$ are independently from each other hydrogen or alkyl having 1 to 40 carbon atoms or phenyl.

5. The formulation according to claim 1,
wherein R$^5$ is at each occurrence independently hydrogen or alkyl having 1 to 20 carbon atoms or phenyl.

6. The formulation according to claim 1,
wherein the surface-modified zirconium dioxide nanocrystals are at least partially capped with a silicone capping agent and optionally a second capping agent selected from the list consisting of vinyltrimethoxysilane, allyltrimethoxysilane, 1-hexenyltrimethoxysilane, 1-octenyltrimethoxysilane, methyltrimethoxysilane, ethyltrimethoxysilane, propyltrimethoxysilane, propyltriethoxysilane, n-octyltrimethoxysilane, n-octyltriethoxysilane, n-dodecyltrimethoxysilane, n-dodecyltriethoxysilane, n-hexadecyltrimethoxysilane, and/or octadecyltrimethoxysilane.

7. The formulation according to claim 6,
wherein the silicone capping agent comprises a head group covalently linked to said zirconium dioxide nanocrystals and a tail group, wherein said tail group comprises at least a silicone chain.

8. The formulation according to claim 1,
wherein said formulation comprises a solvent system with two groups of solvents A) and B),
wherein group A) is one solvent or a mixture of two or more solvents having a boiling point of <90° C. and group B) is one solvent or a mixture of two or more solvents having a boiling point of >90° C.

9. The formulation according to claim 8,
wherein group A) is selected from the list consisting of esters, ethers and ketones and group B) is selected from the list consisting of esters, ethers, alkanes and aromatic solvents.

10. A method for preparing the formulation according to claim 1,
wherein a polymer containing a first repeating unit M$^1$ and a second repeating unit M$^2$ is mixed with a dispersion of surface-modified zirconium dioxide nanocrystals.

11. An encapsulation material for an LED, obtainable by
(a) providing a formulation according to claim 1; and
(b) curing said formulation at a temperature of 70 to 300° C. for a period of 1 to 24 h.

12. A LED comprising the encapsulation material according to claim 11.

13. The LED according to claim 12,
wherein the encapsulation material is comprised in a converter layer which comprises one or more converters selected from phosphors and/or quantum materials.

14. A method for producing an LED comprising the steps of
(a) applying a formulation according to claim 1 to an LED precursor; and
(b) curing the formulation at a temperature of 70 to 300° C. for a period of 1 to 24 h.

15. The method for producing an LED according to claim 14,
wherein the formulation which is applied in step (a) to an LED precursor forms part of a converter layer which preferably comprises one or more converters selected from phosphors and/or quantum materials.

16. The method for producing an LED according to claim 14,
wherein the formulation is applied in step (a) by spray coating.

17. The method for producing an LED according to claim 16,
wherein the formulation comprises a solvent system with two groups of solvents A) and B),
wherein group A) is one solvent or a mixture of two or more solvents having a boiling point of <90° C. and group B) is one solvent or a mixture of two or more solvents having a boiling point of >90° C.

18. The method for producing an LED according to claim 17,
wherein group A) is selected from the list consisting of esters, ethers and ketones and group B) is selected from the list consisting of esters, ethers, alkanes and aromatic solvents.

* * * * *